US 6,320,200 B1

(12) United States Patent
Reed et al.

(10) Patent No.: US 6,320,200 B1
(45) Date of Patent: Nov. 20, 2001

(54) SUB-NANOSCALE ELECTRONIC DEVICES AND PROCESSES

(75) Inventors: Mark A. Reed, Southport, CT (US); James M. Tour, Columbia, SC (US)

(73) Assignees: Yale University, New Haven, CT (US); University of South Carolina, Columbia, SC (US)

(*) Notice: Subject to any disclaimer, the term of this patent is extended or adjusted under 35 U.S.C. 154(b) by 0 days.

(21) Appl. No.: 08/595,130

(22) Filed: Feb. 1, 1996

Related U.S. Application Data

(63) Continuation-in-part of application No. 08/261,867, filed on Jun. 16, 1994, now abandoned, which is a continuation-in-part of application No. 07/891,605, filed on Jun. 1, 1992, now abandoned.

(51) Int. Cl.$^7$ .......................... H01L 35/24; H01L 51/00; H01L 23/58
(52) U.S. Cl. ..................... 257/40; 257/487; 438/49; 438/957
(58) Field of Search ...................... 257/40, 487; 327/564, 327/565, 566, 567; 438/49, 957

(56) References Cited

U.S. PATENT DOCUMENTS

| | | | |
|---|---|---|---|
| 4,581,621 | 4/1986 | Reed | 257/20 |
| 4,751,194 | 6/1988 | Cibert et al. | 438/796 |

(List continued on next page.)

OTHER PUBLICATIONS

IBM Technical Disclosure Bulletin, vol. 31, No. 9, Feb. 1989.*
Kenny et al., "Synthesis of Molecular Lines, Rigid Linear Molecules with Nanometer Scale Dimensions", J. Chem., Soc., Chem. Commun., 1988, pp. 84–85.
Hush, et al. "Electron and Energy Transfer Through Bridged Systems. 6. Molecular Switches: The Critical Field . . . ", J. Am. Chem. Soc. 1990, 112, 4192–4197.
Farazdel, et al., "Electric Field Induced Intramolecular Electron Transfer in Spiro π–Electron Systems and Their Suitability . . . ", J. Am. Chem. Soc. 1990 112, 4206–4214.
Stille, "Palladium catalyzed coupling of organotin reagents with organic electrophiles," Pure & Appl. Chem. vol. 57, No. 12, pp. 1771–1780 (1985).
Hush, et al. Electron and Energy Transfer Through Bridged Systems. 6. Molecular Switches: The Critical.

(List continued on next page.)

Primary Examiner—Gary Geist
Assistant Examiner—Everett White
(74) Attorney, Agent, or Firm—Fish & Richardson P.C.

(57) ABSTRACT

An integrated circuit structure including a plurality of transistors; a plurality of thin-film conductor interconnects, interconnected to form electronic circuits in a predetermined electrical configuration; and a plurality of pairs of contact pads, connected to the thin-film conductor interconnects, each adjacent pair of contact pads including a first pad of a first conductive material and a second pad of a second conductive material, and being electrically connected only by a conductive oligomer of a precisely determined number of units.

4 Claims, 7 Drawing Sheets

U.S. PATENT DOCUMENTS

| | | | |
|---|---|---|---|
| 4,769,683 | 9/1988 | Goronkin et al. | 257/20 |
| 4,783,427 | 11/1988 | Reed et al. | 438/285 |
| 4,799,091 | 1/1989 | Reed | 257/25 |
| 4,803,173 | 2/1989 | Sill et al. | 438/296 |
| 4,835,578 | 5/1989 | Ohtoshi et al. | 257/15 |
| 4,860,064 | 8/1989 | Luryi | 257/14 |
| 4,894,526 | 1/1990 | Bethea et al. | 250/214.1 |
| 4,902,912 | 2/1990 | Capasso et al. | 327/568 |
| 4,903,101 | 2/1990 | Maserjian | 257/21 |
| 4,992,388 | 2/1991 | Pfiester | 438/290 |
| 4,999,682 | 3/1991 | Xu et al. | 257/13 |
| 5,006,911 | 4/1991 | Sivan | 257/328 |
| 5,013,683 | 5/1991 | Petroff et al. | 117/86 |
| 5,026,894 | 6/1991 | Tour et al. | 558/46 |
| 5,032,877 | 7/1991 | Bate | 257/25 |
| 5,036,371 | 7/1991 | Schwartz | 257/14 |
| 5,047,355 | 9/1991 | Huber et al. | 438/478 |
| 5,059,695 | 10/1991 | Tour et al. | 549/4 |
| 5,073,893 | 12/1991 | Kondou | 372/45 |
| 5,093,699 | 3/1992 | Weichold et al. | 257/192 |
| 5,105,232 | 4/1992 | de Alamo et al. | 257/24 |
| 5,107,316 | 4/1992 | Jelley et al. | 257/432 |
| 5,114,877 | 5/1992 | Paoli et al. | 438/36 |
| 5,126,804 | 6/1992 | Nagai et al. | 257/14 |
| 5,130,762 | 7/1992 | Kulick | 257/85 |
| 5,138,408 | 8/1992 | Ando | 257/134 |
| 5,138,625 | 8/1992 | Paoli et al. | 372/46 |
| 5,142,641 | 8/1992 | Fujioka | 257/361 |
| 5,144,580 | 9/1992 | Niu et al. | 365/149 |
| 5,153,687 | 10/1992 | Ishikawa et al. | 359/248 |
| 5,160,992 | 11/1992 | Gerard et al. | 359/326 |
| 5,170,226 | 12/1992 | Fukuzawa et al. | 257/14 |
| 5,175,740 | 12/1992 | Elman et al. | 372/45 |
| 5,191,784 | 3/1993 | Jelley et al. | 73/31.06 |
| 5,200,969 | 4/1993 | Paoli | 372/50 |
| 5,202,290 | 4/1993 | Moskovits | 438/478 |
| 5,214,664 | 5/1993 | Paoli | 372/46 |

OTHER PUBLICATIONS

Stille, "The Palladium–Catalyzed Cross–Coupling Reactions of Organotin Reagents with Organic Electrophiles," *Angew Chem. Int. Ed. Engl.* 25 (1986) 508–524.

Sonogashira, et al., "A Convenient Synthesis of Acetylenes: Catalytic Substitutions of Acetylenic Hydrogen with Bromalkenes, Iodoarenes, and Bromophyridines," *Tetrahedron Letters* No. 50. pp. 4467–4470 (1975).

Stephens, "The Substitution of Aryl Iodides with Cuprous Acetylides. A Synthesis of Tolanes and Heterocyclics," *Sub. of Aryl Iodides with Cuprous Acetylides*, 3313–3315 (Dec., 1963).

Suffert, et al., "Towards Molecular Electronics: A New Family of Aromatic Polymine Chelates Substituted with Alkyne Groups", *Tetrahedron Letters*, vol. 32, No. 6, pp. 757–760 (1991).

Callahan, et al., "The Tertiary Butyl Group as a Blocking Agent for Hydroxl, Sulfhydryl and Amido Functions in Peptide Synthesis," *tert–Butyl Group as Blocking Agent in Peptide Synthesis*, 201–207 (Jan. 10, 1963).

Nishimura, et al., "New Method for Removing the S–p–Methoxybenzyl and S–t–Butyl Groups of Cysteine Residues with Mercuric Trifluoroacetate," *Chem. Pharm. Bull.*, 26(5) 1576–1585 (1978).

Miller, "Molecular Electronics?**"*Adv. Mater.* 2 (1990) No. 8 378–379, 492–497, 601–603.

Tour, et al., "Synthesis and UV–Visible Properties of Soluble α–Thiophene Oligomers. Monomer to Octamer," *American Chemical Society*, 1901–1907 (Mar. 30, 1992).

Tour, et al., "Extended Orthogonally Fused Conducting Oligomers for Molecular Electronic Devices," *American Chemical Society*, 7064–7066 (Aug. 28, 1991).

Tour, et al., "Approaches to Orthogonally Fused Conducting Polymers for Molecular Electronics," *American Chemical Society*, 5662–5663 (Jul. 4, 1990).

Yoshimura, et al., "Quantum Wire and dot formation by chemical vapor deposition and molecular layer deposition of one–dimensional conjugated polymer," *American Institute of Physics* 268–270 (Jan. 20, 1992).

Zecevic, et al., "Spectroscopic and Electrochemical Studies of Transition Metal Tertrasulfonated Phthalocyanines", *J.Electroanal. Chem.* 196 (1985) 339–358.

* cited by examiner

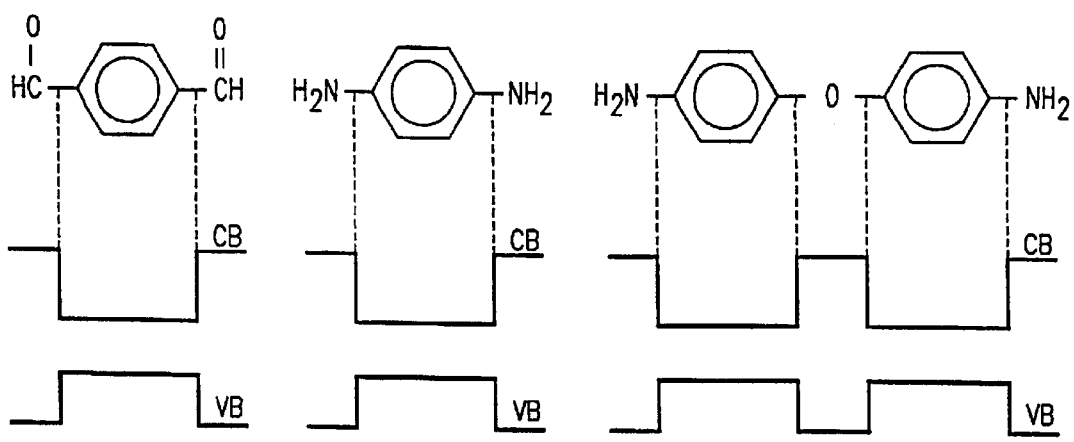
FIG. 4A    FIG. 4B    FIG. 4C
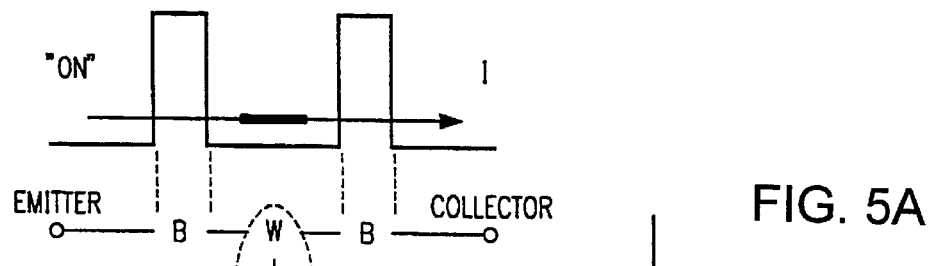
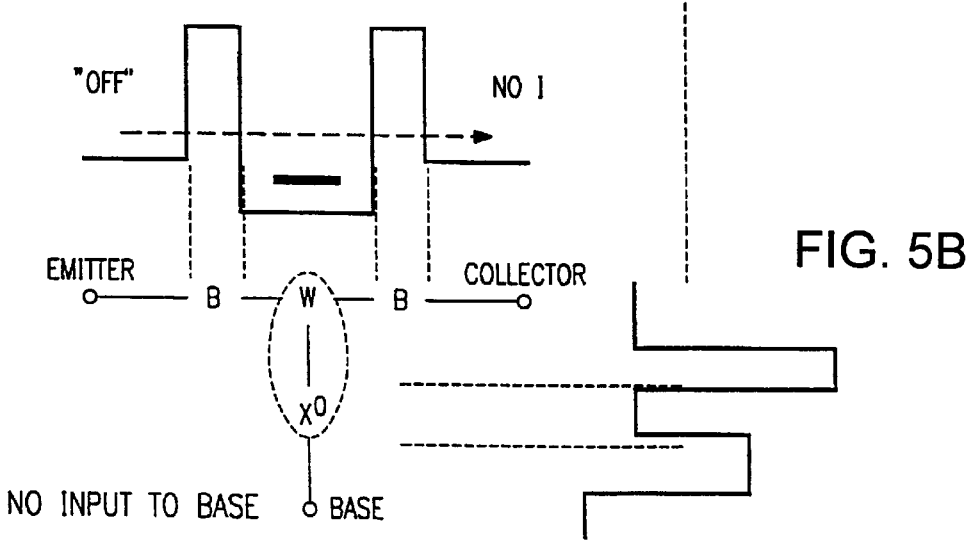
FIG. 5A
FIG. 5B

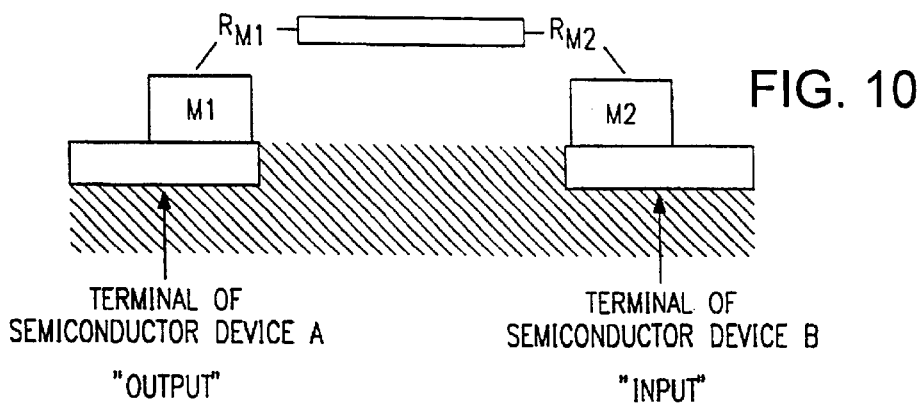
FIG. 10
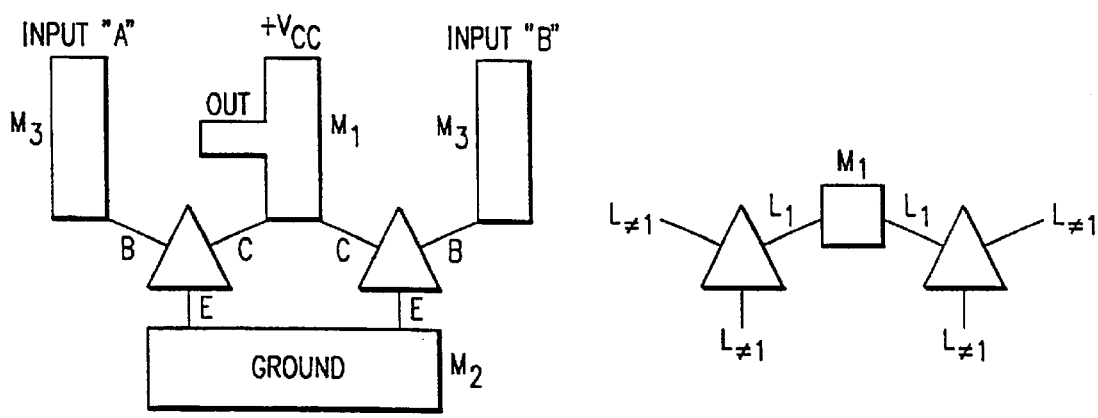
FIG. 11
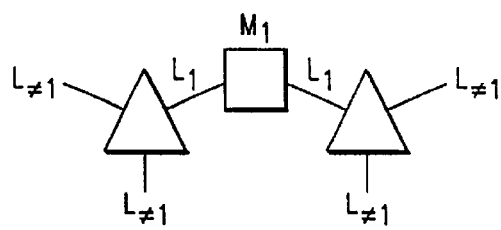
FIG. 12
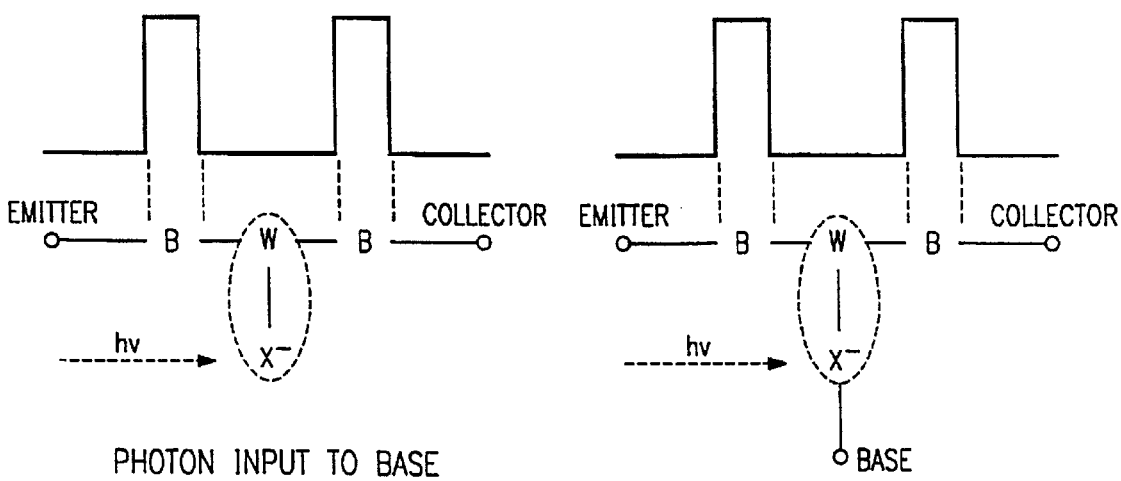
FIG. 13A — PHOTON INPUT TO BASE
FIG. 13B — ELECTRONIC INPUT TO BASE

IONIC INPUT TO BASE

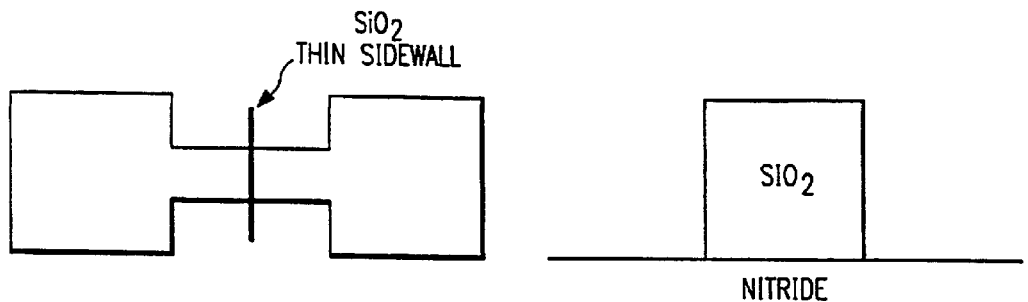
FIG. 14D1  FIG. 14D2
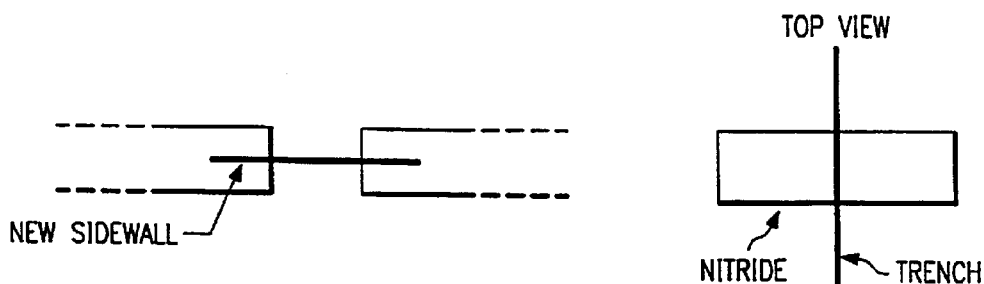
FIG. 14E1  FIG. 14E2
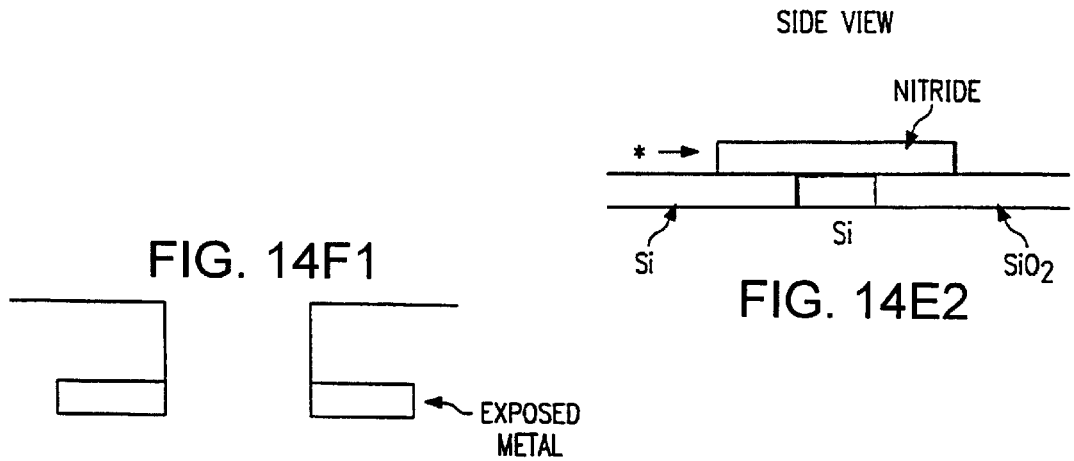
FIG. 14F1
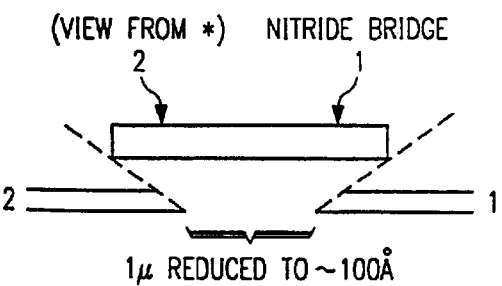
FIG. 14F2

SUB-NANOSCALE ELECTRONIC DEVICES AND PROCESSES

This application is a C-I-P of Ser. No. 08/261,867 filed Jun. 16, 1994 abandoned which is a C-I-P of Ser. No. 07/891,605 filed Jun. 1, 1992 abandoned.

PARTIAL WAIVER OF COPYRIGHT

All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsimile reproduction by anyone of the patent document or patent disclosure, as it appears in the United States Patent and Trademark Office patent file or records, but otherwise reserves all copyright and maskwork rights whatsoever.

BACKGROUND AND SUMMARY OF THE INVENTION

The present inventions relate to a new generation of electronic microcircuit technology, having dimensions much smaller than those of semiconductor integrated circuits, and to related systems and processes.

To better explain the significance and advantages of these innovations, the following paragraphs will review some technological context. This technological context is not necessarily prior art, but is intended to help in pointing out the disclosed inventions.

The Era of Downscaling

Since about 1960, the steady downscaling of integrated circuit minimum dimensions has permitted ever-increasing density, and thus an ever-increasing range of functionality at an ever-more favorable cost. This wealth of opportunity has permitted system designers to introduce many of the electronic products which have revolutionized industry and daily life in these decades. Continued downscaling steadily improves the available functionalities and pricing, and thus steadily challenges system designers. This fosters a continuing climate of active innovation and competition.

The most obvious index of downscaling is the steady reduction in the "minimum geometry" which can be specified for fabrication of an integrated circuit. This corresponds to a reduction in the size and spacing of the individual transistors, and thus steadily increases the number of transistors which can be fabricated in a given area. However, it is important to note that scaling has also provided exponential improvements in device speed and power dissipation, which has led to substantial enhancement of system performance. Thus, an end to the epoch of downscaling would drastically reduce the speed of progress in electronics.

Limitations of Semiconductor Microelectronics

The danger now in sight is that the downscaling of minimum geometries of transistor-based integrated circuits will eventually be brought to an end by a combination of problems related to devices, interconnections, noise, and reliability.[1] The resulting saturation of circuit densities almost certainly implies a saturation of the historical exponentially downward trend in cost and volume per bit or function.

[1]These issues have been widely discussed; see, e.g., Chatterjee et al., 130, PROC. IEE 105 (1983), which is hereby incorporated by reference.

A technology-dependent issue is where existing ULSI ("ultra-large-scale integration," i.e. semiconductor fabrication with minimum dimensions of a micron or less) will usefully end. From recent work, it is reasonable that this will occur in the 0.1 micron regime; scaling to just the 100s of Å level may not be cost-effective in relation to the development costs of the technology. Thus, identifying an atomic-scale device technology seems the only approach worth the investment.

Several constraints are visibly converging to cut off the advantages of further scaling. While it is likely that clever process modifications can postpone the impact of some constraints, it does not seem likely that all can be avoided.

Alignment Tolerances

One of the basic problems is alignment tolerances: formation of features at a small minimum size $\lambda$ does not imply that that minimum size can be used for fabrication of working circuits: it is also necessary to have alignment tolerances which are much smaller than $\lambda$ (preferably well under $\lambda/4$). (Thus, a $0.8\mu$ lithography process will typically have a specified alignment tolerance of $\pm 0.15\mu$ or less.)

With further scaling, this imposes several nonobvious difficulties. One is thermal stability, as discussed below.

Dopant Diffusion Lengths

Diffusion lengths scale approximately as $(Dt)^{1/2}$, where t is time at the highest temperature, and D is a temperature-dependent diffusion constant characteristic of the dopant and the background material. As dimensions are reduced, the dopant diffusion lengths in silicon are posing difficulties in process design. In the past decade, many accommodations have been made to reduce dopant mobility and to reduce time at high temperatures. However, it is not clear that such accommodations can be continued indefinitely. For example, arsenic (or antimony) dopants are now used increasingly in place of phosphorus, but there is no suitale N-type dopant with significantly lower diffusivity than these two.

Punch-through, Doping Levels, Electric Fields, and Hot Electrons

A voltage applied across a semiconductor junction (in the reverse-bias direction) will naturally create a depletion region around the junction. The width of the depletion region depends on the doping levels of the semiconductor. If the depletion region spreads to contact another depletion region, "punch-through," i.e. uncontrolled current flow, may occur.

Higher doping levels will help to minimize the separations required to prevent punch-through. However, if the voltage change per unit distance is large, this creates a further difficulty.

A large voltage change per unit distance implies that the magnitude of the electric field is large. An electron traversing such a sharp gradient may be accelerated to an energy level significantly higher than the minimum conduction band energy. Such an electron is known as a "hot" electron, and may be sufficiently energetic to pass through an insulator. Thus, hot electrons can irreversibly degrade some common types of devices.

Isolation in a Monolithic Semiconductor Substrate

Conventional semiconductor integrated circuit technology uses a monolithic substrate which is all one crystal. Such substrates provide great advantages in processing. However, this device architecture poses some inherent difficulty with further scaling. One difficulty is lateral isolation of devices from each other. Another difficulty is leakage current scaling. Another difficulty is presented by the diffusivity of carriers within the substrate: free carriers (generated, e.g., by an alpha particle hit) can diffuse over many tens of microns to help neutralize a stored charge. Some attempts have been made to overcome these difficulties by using total isolation from the substrate, but to date such technologies have not demonstrated favorable economics of scaling.

Considerations in Further Downscaling

Theoretically, further downscaling of devices would still be achievable with the appropriate device technology, IF the approach could simultaneously address the interconnection, reliability, and implied fabrication limitations. Estimates based on abstract physical switching device models which are independent of specific device technologies indicate that several orders of magnitude in downscaling of device power in devices would be theoretically permitted,[2] if an appropriate device technology could be found. The key to this search is to employ electronic phenomena which are characterized by dimensions much smaller than the depletion layer widths and diffusion lengths which provide the basis for conventional transistor function.

[2]See R. T. Bate, "VLSI Electronics" (N. G. Einspruch, ed.), Vol. 5, p. 359 (Academic Press 1982), which is hereby incorporated by reference.

Limitations of Semiconductor Nanoelectronics

Within the last decade, tremendous progress in semiconductor nanofabrication and nanoscale spatial and charge quantization phenomena has bridged the gap from the 0.1 micron regime to the ~10s of Å scale, and even to the atomic level with scanning probe techniques.[3] These advances allow one to create electronic structures that exhibit manifest quantum and single electron effects. However, proposed solid state device implementations at this level suffer from three problems. The first is critical dimensional control. Electron devices which operate in this range must operate by tunneling, since a barrier (heterostructure, oxide, or otherwise) is a prerequisite for isolation in a 3-terminal device that can exhibit gain. However, electron tunneling is exponentially sensitive to atomic-layer fluctuations in the tunneling barriers, resulting in device characteristic variations unacceptable for large scale integration. Secondly, device embodiments utilizing discrete electron charging (single electron transistors, or SETs) suffer from reduced operating temperatures; for room temperature operation, 1 nm or less size junctions are required, dimensions which imply severe tunnel barrier fluctuation problems for solid state embodiments. Finally, none of these approaches address the interconnection and alignment problems. It is instructive to note that these investigations have had little impact on extending ULSI, due to the fundamental limitations of conventional semiconductor devices and fabrication. Fabrication at the nanoscale, and ultimately at the atomic level, of even the simplest structures (interconnects and contacts) is a daunting task. Techniques such as electron beam and STM[4] lithography for pattern transfer appears to bottom out at ~100 Å, due to the requirement of pattern transfer. Atomic manipulation with scanning probes has been demonstrated, but it is unlikely that this technique will be more than a laboratory curiosity since it is essentially a serial approach. (This criticism also holds for STM micromachined arrays, due to registration and access time limitations).

[3]See for example, NANOSTRUCTURE PHYSICS AND FABRICATION, edited by M. A. Reed and W. P. Kirk, Academic Press, 1989; and NANOSTRUCTURES AND MESOSCOPIC SYSTEMS, edited by W. P. Kirk and M. A. Reed, Academic Press, 1992; both of which are hereby incorporated by reference.
[4]"STM" is a conventional abbreviation for scanning tunnelling microscope (or microscopy).

Solid state embodiments of quantum size electronic devices suffer from a number of problems. They are:

Dimensional Fabrication Tolerance: In a quantum device that utilizes quantum size effects, the intrinsic energy levels (and therefore the threshold voltage) are at least inversely proportional to the size of the device, dependent on the detailed shape of the device potential. If there are fabrication-induced dimensional variations, the quantum state energy will be different from device to device. The smaller the device becomes, the larger the voltage fluctuations. For many semiconductors, such as silicon and gallium arsenide, it is impossible to both make the device small enough such that the quantum energy level spacing is large compared to room temperature thermal energy, and large enough such that a fluctuation of a single monolayer does not unacceptably shift the threshold voltage.

Fabrication Tolerance Limits: Fabrication tolerance is critical when a tunnel barrier (semiconductor or metal oxide) is used. The current transmitted through the tunnel barrier is exponentially proportional to the tunnel barrier thickness, so again one has the limitation of changes of a single monolayer from device to device in a ULSI circuit will drastically change the output current, and therefore the input voltage to the next stage. The only way to reduce this intrinsic problem (other than a fabrication scheme which guarantees atomic precision) is to increase the barrier thickness to the point where a monolayer thickness fluctuation does not affect the overall current. However, this drastically reduces current density, and thus does not make a good device. Most useful semiconductor and metal oxide tunnel barriers are in the range 5–10 monolayers.

Contact Statistics: When one makes a quantum device, the contacts to the device must also be reduced to this dimension. If the ohmic contact between devices is made too small, the wavefunction of one device will overlap the second device. This has been demonstrated in high mobility two-dimensional gas layers, where the change of the wavefunction in one part of the layer remotely affected another part. This is not acceptable, since electron devices as we know them must have isolation from one to the next. This implies that the minimum distance between devices is the inelastic scattering length, which is approximately a few tens of nanometers in useful semiconductor materials. Since this defines a minimum contact volume (i.e., a few hundred cubic Ångstroms), we can estimate the number of dopant atoms in the contact, which for this size is only a few tens of dopant atoms. This means that the statistical fluctuations in the number (and position) will dramatically shift the voltage threshold.

Temperature and Voltage Limits: Quantum wave mechanical devices suffer not only from the above mentioned fabrication fluctuation problems, but also from low temperature/voltage intrinsic limitations. A wave mechanical interference device may be conceived where the output is modulated by an external gate or potential. However, destructive interference of the waves implies that the wave is monochromatic; this implies that only one subband can be used. Not only does this imply very low temperature operation (the electron energy distribution at the Fermi level must be much less than the room temperature thermal distribution), but the maximum conductance of the device is intrinsically very low (80 $\mu$S).

Proposed "Waveguide" Devices: A different proposed structure is the "waveguide" type of device, in which it has been suggested that the electron wavefunctions will remain in a standing wave pattern which can be changed by inducing a reactance shift at a control point (analogous to an RF stub tuner). However, this proposal has a difficulty due to the multiple subbands available for electrons in semiconductors: sincce the different subbands will typically have different effective wavelengths in a physical structure, the phase shifts which switch the lowest subband off will not necessarily switch off the higher subbands.

The Interconnect Problem: Even if a technology can be identified which solves the device scaling problem, the problems of interconnections and reliability will require revolutionary solutions. The "interconnect problem" is manifested as propagation delays in device interconnections that limit ultimate system performance. This is especially crucial for the complex logic circuitry of general-purpose processors. Though incremental evolutionary improvements in present transistor technology will surely continue, the resultant yield loss and subsequent increase in cost-per-function will eventually reach a minimum. An interesting example of these limitations is the problem of achieving large dynamic range alignment in this regime. Imagine that in the future one could achieve 100 Å pitch and size active devices, which corresponds to approximately 1 part in $10^7$ dimensional resolution when approximately conserving present chip dimension, for cost and function scaling. This implies optimistically demanding less than 0.05° C. temperature gradients during any fabrication step requiring alignment, which are clearly untenable dimensional and thermal requirements.

The ultimate device technology (if it exists) at this scale, independent of device embodiment, will thus solve the interconnection problem and will be predominantly self-aligned.

The generic properties of a technology which addresses the critical problems can be detailed as follows:

a key innovation must be the solution to the interconnect problem.

The fabrication technology must be predominantly self-aligned, perhaps non-lithographic and self-limiting.

Scaling to the atomic level, and room temperature operation, is desired.

Conjugate Conductive Polymers[5]

A vast amount of work has been done, by chemists and physicists, in studying the structure, synthesis, and electronic behavior of conjugated conductive polymers.[6] For many years these materials were not candidates for commercial applications; but more recently newer families of materials have been identified.

[5]In this application, the term "conductive polymer" is used only to refer to conjugated polymers (in which the conjugation of π orbitals leads to electron delocalization, and hence to the potential for high conductivity with appropriate doping). Unfortunately, this term is also used, in engineering literature, to refer to a quite different class of materials, in which a conductive particulate material (typically graphite or metal fibers or powder) is incorporated as filler in a nonconducting polymer matrix.

[6]See generally all of the articles in the two-volume set *Handbook of Conducting Polymers* (ed. Skotheim 1986), and the references cited in those articles; all of which are hereby incorporated by reference.

π-orbitals and Extended States

"Conjugated" conductive polymers are those which have overlapping π-orbitals. The resulting extended molecular orbitals provide a pathway through which electrons can travel, IF an external field is applied and IF excess electrons are present, to provide conduction.

Note that conjugated bonding is not itself sufficient to provide good conduction. Therefore, conductive polymer molecular structures often include "dopant" atoms which are selected to provide an adequate carrier density for conduction.

Improvements in Conductivity

Modern conductive polymer compounds have achieved bulk conductivities of greater than 1 $Scm^{-1}$. This begins to be comparable with metals. (For example, the bulk conductivity of copper is slightly less than 600 $Scm^{-1}$.)

Improvements in Stability

Dramatic improvements have occurred in chemical stability of conductive polymers. The first extensively studied material was polyacetylene, which is unstable and highly reactive with oxygen, but a succession of investigators have found more stable and less reactive materials with higher conductivities, as detailed below.

Innovative Systems, Modules, Circuits, Devices, and Methods

The present application discloses a novel technological approach which fits these requirements, and can lead to a new era in ultra-dense electronic systems.

Among the disclosed innovations is self-aligned spontaneous assembly of chemically synthesized interconnects, active devices, and circuits. This is a revolutionary approach for spontaneously assembling atomic scale electronics. It attacks the interconnection and critical dimension control problems in one step, and is implicitly atomic scale. Concurrently, the approach utilizes an inherently self-aligned batch processing technique which addresses the ultimate fabrication limitations of conventional ULSI.

There has been sporadic discusssion of molecular electronic devices for some years now. However, one key deficit of all previous proposals is their failure to solve the problem of achieving electrical GAIN in a molecular electronic device. The technology disclosed below provides a true gain modulation, by modulating the electron wavefunction of a polymeric conductor.

The innovative technology disclosed herein also radically improves the economics of downsizing electronic devices. In conventional semiconductor technology, the cost per transistor is no longer decreasing with reduced size; but the disclosed innovative technology returns to a regime of more favorable cost evolution.

The innovative technology disclosed herein provides an inherently very high degree of self-alignment in processing. Moreover, this new technology is inherently very well suited to batch processing. Many of the problems of fabrication tolerance, which limit the further progress of conventional methods, are solved in the new technology by chemical purification and selection techniques.

New Interconnect Technology

Among the many innovations disclosed herein is a new self-aligned integrated circuit interconnect technology which uses conductive polymers. This technology has many features in common with the active device embodiments described below, but can be exploited independently of those embodiments.

Self-Assembling Wires

There exist non-semiconductor candidates for atomic scale electronic structures which are presently at the molecular level. Since the 1970s, researchers have been exploring 1D conductive organic polymers, such as polyacetylene. Advances in synthesis have identified more promising candidates, such as diphenylpolyene, polythyolenes, polyarylenevinylene, polyarylene, polyphenylene, and polythiophenes. Conductivities of these wires (such as doped polyacetylene) have approached that of copper.[7] These organic chains can have long electron delocalization lengths; for example, delocalization lengths of 20–34 atoms can be calculated from diphenylpolyene results,[8] and ~50 Å for polythiophenes.[9]

[7]See Chiang et al., 100 J.AM.CHEM.SOC. 1013 (1978), which is hereby incorporated by reference.

[8]See the paper by C. W. Spangler which was presented at *The 2nd Internanonal Conference on Molecular Electronics—Science and Technology*, Dec. 15–19, 1991, St. Thomas, USVI (unpublished), and which is hereby incorporated by reference.

[9]See the paper by J. Tour presented at PROCEEDINGS OF THE 2ND INTERNATIONAL CONFERENCE ON MOLECULAR ELECTRONICS—SCIENCE AND TECHNOLOGY, Dec. 15–19, 1991, St. Thomas, USVI (unpublished), which is hereby incorporated by reference.

Though the synthesis of 1D molecular wires has been known for some time, the inability to manipulate and assemble organic structures into useful complexes in a manner analogous to semiconductor devices has hindered any application toward electronics. The isolation and measurement of a single organic 1D wire, a key step toward electronic utilization of conductive polymers, has yet to be demonstrated (though the conductivity of large assemblages of the material has been measured). Yet the utilization of the atomic-scale control inherent in organic synthesis could provide an elegant solution to the fundamental fabrication limitations described previously.

The present application presents a new approach which combines molecular synthesis and nanofabrication. We take a conductive polymer, and attach ("functionalize") onto the ends a compound that can selectively attach to a metal probe. Numerous examples of these "self-assembling" compound/metal pairs are known; for example, n-alkanethiols onto Au, isonitrile onto Pt, and alkanecarboxylic acid onto aluminum oxide.[10] This is in essence a conducting string with sticky ends, which could bridge a gap between metallic contacts (of the selective metal). By fabricating (by E-beam or STM) closely-spaced metallic contacts, the molecular wire can be spontaneously deposited from solution. Note that if the molecular wire is synthesized with different end groups on opposing ends, the polarity of the attachment can be defined. The specific contact resistance of such an ohmic contact is not yet precisely known, though the large value of the bond energies imply this may not be a problem; for the organic thiolates and Au, this is 40–45 kcal/mole. These "selective-attachment conducting polymers" (specifically, conjugated organic oligomers with functionalized selective attachment termini) provide a technique for spontaneously generating contacts between metallic endpoints, at the molecular scale (10–100 Å).

[10]See the paper by G. M. Whitesides and P. E. Laibinis at 6 LANGMUIR 87 (1990), which is hereby incorporated by reference.

An advantageous application is for simple self-aligned interconnects; given a device with metal A on one terminal (for example, collector), and a second device with metal B on one terminal (for example, base), a molecular wire with end groups A' and B' (which attach selectively to A and B, respectively) can bind selectively to make an interconnect, without a lithography step. Though we will see that interconnects are not the most important application, this spontaneous "lock-and-key" concept is the basic ingredient. Also note that this process is, to a degree, length dependent. Interconnections of contacts separated by longer than the designed molecular wire length are prevented. An important technology issue is the nuisance of unwanted binding of the polymers other than at the terminal ends. It appears that this concern can be solved for large metallic contacts (other than simple binding posts) by either selective exposure of the metal (i.e., in the simplest case by via holes) through an insulating overlayer coating at only the contact points desired, or by post-attachment scavenging of the unwanted dangling molecular wires.

Selective Auto-connection to Terminals

The disclosed process innovations provide a self-aligned connection of molecular "wires" to their target terminals. If the deposition process is allowed to go to completion, the number of polymer chains connected in parallel will be determined by the available area of the semiconductor or metal contact which the chains are attaching to.

Active Device Operation

One class of sample embodiments operates using the principle of resonant tunnelling.

FIG. 1A shows a resonant tunnelling device in the on-state. Note that an energy level in the well region provides an allowed transition for electrons which tunnel through the barrier into the well. Such electrons can then tunnel through the second barrier to a region of lower potential, providing a net current.

FIG. 1B shows the device of FIG. 1A in the off-state (after the potential of the base has been shifted). In this state the well no longer has an allowable energy state at the potential of incoming electrons. Therefore, normal conduction electrons cannot tunnel through the two barriers sequentially.

These Figures provide a simple schematic representation of a principle of operation which has been extensively analyzed, and which has been realized in heterojunction semiconductor devices. In such devices, the well region must be physically very small to produce the needed separation of allowable energy states, and these small dimensions cause the fabrication difficulties reviewed above.

However, the innovations disclosed in the present application provide a different way to achieve the same principle of operation (and also other principles of operation). Polymeric molecular structures are manipulated to produce combinations of well and barrier regions, with connections so that the well and/or barrier potentials can be manipulated.

FIG. 4A shows the spatial variation of conduction band (CB) and valence band (VB) energy levels across a first example monomer unit which can form conjugated conductive polymer structures. FIG. 4B shows the spatial variation of conduction band (CB) and valence band (VB) energy levels across a second example monomer unit which can form conjugated conductive polymer structures. FIG. 4C shows how, when two such monomer units are chemically combined, the resulting dimer structure has a band structure which produces a barrier-well-barrier-well-barrier profile.

FIGS. 5A and 5B are a corresponding pair of drawings of two states of operation of a novel molecular electronic device.

FIG. 5A shows the ON state. In this state an energy level in the well region is aligned with the energy level of incoming electrons, and thus resonant tunnelling can occur, to produce a net flow of electrons from the "emitter" terminal through to the "collector" terminal.

FIG. 5B shows the OFF state. In this state a different potential has been induced at the "base" terminal. This induced potential propagates, through the chain X, to change to energy levels in the well region. As a result of this change, no energy level in the well region is aligned with the energy level of incoming electrons, and thus resonant tunnelling does not occur, and therefore current flow does not occur between the "emitter" terminal and the "collector" terminal.

Modulation of Conductor's Conductivity

With a conductive polymer (unlike a semiconductor structure) there are two ways to change the conductivity of the structure. FIGS. 5A and 5B show one architecture, in which the well potential is modulated to achieve gated resonant tunnelling. However, another alternative is to modulate the BARRIER height, as shown in FIGS. 2A and 2B. In this alternative, the modulator chain would be coupled to a barrier location rather than to a well location.

The "Base Isolation" Barrier

To connect the modulator chain to the conductor chain, a coupling unit is preferably used which corresponds to a well in the prinary conductor chain. From the base connection point, the modulator chain is (in the presently preferred embodiment) highly conjugated for short period; then a relatively high barrier is interposed, then a well, then a lower barrier; then the modulator chain is conductive for as long as needed. The barrier$_{high}$-well-barrier$_{low}$ structure serves, in effect, as a base isolation barrier. Note that gain would not be possible without some form of "base isolation." Thus, this feature of the architecture gives substantial advantages.

Electrical Asymmetry of the Active Device

To get electrical asymmetry between Emitter→Collector and Collector→Emitter operation, different barrier heights can be used on different sides of the modulated tunnelling region. Moreover, the position of the modulated tunnelling region within the conductive oligomer chain can easily be made asymmetric if desired.

Connecting Signals into the Coupling Chain

Several methods are disclosed for coupling an input signal into the modulator side-chain of an oligomeric active device. The simplest connects the side-chain to an electrical contact. Another disclosed method uses a photosensitive compound to generate a voltage shift under illumination. Another disclosed method uses direct coupling of the modulator side-chain (the "base") of one active device to the output chain (the "collector") of another.

Also disclosed is a self-aligned contact process for preparing metal pads for the oligomeric conductors to bond to.

Inorganic Starting Structure

Preferably a semiconductor integrated circuit structure provides the starting point for fabrication of moecular devices. The conventional structure provides a transition from macroscopic signals down to the small magnitudes characteristic of molecular electronics. In particular, conventional integrated circuit structures can advantageously provide input ESD protection and output drivers.

Isolation

The isolation problem is not nearly as severe as in semiconductor devices, since there is no continuous substrate for carriers to diffuse through. Conduction normally occurs along a single molecule, and the connections of those molecules are largely defmed by the formation process.

Device Density

Note that the technologies disclosed herein are inherently suitable for 3D fabrication—as opposed to any planar technology, in which more layers implies more process steps.

Interconnect Density

The novel interconnect technologies disclosed herein provide self-aligned interconnects which are length-constrained, but are NOT limited to line of sight. For example, a molecular electronic active device could even be positioned in an undercut trench if desired.

Configuring SSI-equivalent Gates

It is also easy to configure devices with multiple inputs. For example, the detailed structure of a NOR gate is described below.

Passivation

Not all conductive polymers are as reactive as polyacetylene, but all are at least somewhat prone to react with $O_2$. (In general, doped polymers are more reactive toward owygen than are the corresponding undoped polymers.) However, advances in conductive polymer research in the 1980s revealed that several families (particularly modified thiophenes) are much more stable, and much less reactive toward oxygen. For long-term use, it is still necessary to package such materials in an anaerobic light-shielded package, but this is easily done as described below.

Available Principles of Operation

The electronic transport mechanisms for quantum-sized systems with tunnel barriers are either; a) tunneling through localized states (i.e., resonant tunneling), or; b) hopping (with attendant issues of Coulomb blockade); or, c) a combination of both.

Resonant tunneling (as schematically shown in FIGS. 2A–2C) is a conduction mechanism which depends on quantum mechanical tunneling through a quasi-bound quantum-confined state. The simplest embodiment is a quantum well cladded by thin tunnel barriers. Electrons from the emitter of such a structure tunnel through the first barrier into the central well region, and then quickly tunnel out. If the central quantum state is made to be energetically misaligned with the incoming emitter electrons, such as by a base potential applied to the central quantum well, the current is dramatically reduced. By this mechanism, a transistor with gain can be produced. Such embodiments have been extensively demonstrated in semiconductor devices, but not in molecular electronic structures.

Hopping, or Coulomb blockade, is a different conduction mechanism, wherein the structure can be thought of as a series of small capacitors. If the structure is sufficiently small, the charging energy of the capacitor, $Ec=e^2/2C$, can be so large that it is energetically unfavorable for 2 or more electrons to be on the central terminal; thus, a single electron at a time "hops" through the structure. FIGS. 3A–3C schematically show this mode of operation, and FIG. 3D shows the corresponding electrical model.

The hopping mechanism is differentiated from resonant tunneling mainly by current density; if the collector barrier is sufficiently thin, electrons quickly tunnel through the structure, so Coulomb blockade never has a chance to take effect; thus, resonant tunneling is the mechanism. If the collector barrier is thick and/or high, the electron resides in the central region for a long time, and thus Coulomb blockade occurs.

The advantage of resonant tunneling is that high current density and large gain are possible. In Coulomb blockade, the ultimate limit of an electron device (i.e., a single electron device), the current density is low, and it is as yet unclear that large gain can be achieved in such a device.

According to one embodiment of the present invention there is provided:

A system comprising:

a master clock circuit, and an optical output driver connected to follow the frequency and phase of said master clock circuit;

a plurality of electronic circuits, on one or more integrated circuits, wherein plural ones of said electronic circuits include semiconductor active devices configured as output drivers, and wherein plural ones of said electronic circuits include first and second conductive contacts thereof and a photoconductive oligomeric structure connected therebetween;

and where light from said optical output driver is optically coupled to multiple ones of said photoconducive oligomeric structures in multiple ones of said circuits.

According to another embodimenmt of the present invention there is provided:

A circuit comprising:
a semiconductor integrated circuit, comprising semiconductor driver devices, and electrically configured to be connected to first, second, and third contacts;
a first molecular electronics device, electrically configured to receive a first input signal and to provide a conductivity, between said first and third contacts, which is modulated in accordance with said first input signal;
a second molecular electronics device, electrically configured to receive a second input signal and to provide a conductivity, between said second and third contacts, which is modulated in accordance with said first input signal;
a voltage detection circuit, electrically connected to detect the voltage of said third contact and provide a corresponding output;
whereby said output of said voltage detection circuit provides a signal which is equivalent to a NOR of said first and second input signals.

According to another embodimenmt of the present invention there is provided:

A picoelectronic device comprising:
first and second conductor chains, each comprising multiple monomor units having mutually conjugated bonding;
a first barrier region, connected to said first conductor chain, said first barrier having a potential energy for electrons which is less favorable than that of said first conductor chain;
a second barrier region, connected to said second conductor chain, said first barrier having a potential energy for electrons which is less favorable than that of said second conductor chain;
a well region, connected to said first and second barrier regions, said well region having a potential energy for electrons which is more favorable than that of said first and second barrier regions;
a third barrier region, connected to said well region, said third barrier having a potential energy for electrons which is less favorable than that of said well;
a third conductor chain, comprising multiple monomor units having mutually conjugated bonding, and operatively connected to said well region through said third barrier region;
whereby changing potentials applied to said third chain can effect modulation of currents between said first and second chains.

According to another embodimenmt of the present invention there is also provided:

An integrated circuit structure, comprising:
a plurality of transistors;
a plurality of thin-film conductor interconnects, interconnected to form electronic circuits in a predetermined electrical configuration;
a plurality of pairs of contact pads, connected to said thin-film conductor interconnects, each adjacent pair of contact pads being interconnected being electrically connected only by a conductive oligomer of a precisely predetermined number of units.

According to another embodimenmt of the present invention there is also provided:

An integrated circuit structure, comprising:
a plurality of transistors;
a plurality of thin-film conductor interconnects, interconnected to form electronic circuits in a predetermined electrical configuration;
a plurality of pairs of contact pads, connected to said thin-film conductor interconnects, each adjacent pair of contact pads being electrically connected only by a conductive oligomer of a precisely predetermined number of units.

According to another embodimenmt of the present invention there is also provided:

An integrated circuit structure, comprising:
a plurality of semiconductor transistors;
a plurality of thin-film conductor interconnects, interconnected with said semiconductor transistors to form electronic circuits in a predetermined electrical configuration;
a plurality of pairs of contact pads, connected to said thin-film conductor interconnects;
a plurality of molecular electronic active devices, each including a conductive oligomer connecting one of said contact pads, and a barrier-well-barrier structure connected to modulate the conductivity of said conductive oligomer.

According to another embodimenmt of the present invention there is also provided:

An integrated circuit structure, comprising:
a plurality of transistors;
a plurality of thin-film conductor interconnects, interconnected to form electronic circuits in a predetermined electrical configuration;
a plurality of pairs of contact pads, connected to said thin-film conductor interconnects, each adjacent pair of contact pads including a first pad of a first conductive material and a second pad of a second conductive material, and being electrically connected only by a conductive oligomer of a precisely predetermined number of units.

BRIEF DESCRIPTION OF THE DRAWING

The present invention will be described with reference to the accompanying drawings, which show important sample embodiments of the invention and which are incorporated in the specification hereof by reference, wherein:

FIG. 4A shows the spatial variation of conduction band (CB) and valence band (VB) energy levels across a first example monomer unit which can form conjugated conductive polymer structures. FIG. 4B shows the spatial variation of conduction band (CB) and valence band (VB) energy levels across a second example monomer unit which can form conjugated conductive polymer structures. FIG. 4C shows how, when two such monomer units are chemically combined, the resulting dimer structure has a band structure which produces a barrier-well-barrier-well-barrier profile.

FIGS. 5A and 5B are a corresponding pair of drawings of two states of operation of a novel molecular electronic device.

FIG. 5A shows the ON state. In this state an energy level in the well region is aligned with the energy level of incoming electrons, and thus resonant tunnelling can occur, to produce a net flow of electrons from the "emitter" terminal through to the "collector" terminal.

FIG. 5B shows the OFF state. In this state a different potential has been induced at the "base" terminal. This induced potential propagates, through the chain X, to change to energy levels in the well region. As a result of this change, no energy level in the well region is aligned with the energy level of incoming electrons, and thus resonant tunnelling does not occur, and therefore current flow does not occur between the "emitter" terminal and the "collector" terminal.

FIG. 10 shows a structure in which a conductive polymer provides self-aligned length-selective connection of metal contact pads M1 and M2, to connect semiconductor devices together.

FIG. 11 shows a NOR gate using molecular electronic devices.

FIG. 12 shows a structure in which length-selective oligomeric interconnects provide interconnection and electrical orientation of molecular electronic devices.

FIGS. 13A, 13B, and 13C show three alternative structures for inputting a signal into the modulator side-chain (in a device like that of FIGS. 5A and 5B):

FIG. 13A shows how photonic input provides a potential change at a photosensitive end-group on the modulator chain;

FIG. 13B shows how electrical input, from a metal or semiconductor contact, provides a direct potential change at an end-group on the modulator chain; and FIG. 13C shows how ionic population shifts, in a micro-localized medium, provides a potential change on the modulator chain.

FIGS. 14A, 14B, 14C, 14D1, 14E1, and 14F1 show a first self-aligned process for fabrication of contacts of two different materials, with sublithographic spacing, in an integrated circuit fabrication process.

FIGS. 14A, 14B, 14C, 14D2, 14E2, and 14F2 show a second self-aligned process for fabrication of contacts of two different materials, with sublithographic spacing, in an integrated circuit fabrication process.

DESCRIPTION OF THE PREFERRED EMBODIMENTS

Figure 1A:
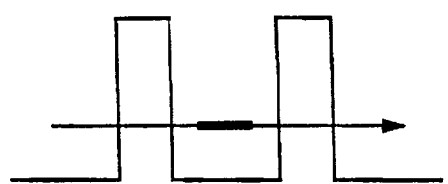
FIG. 1A shows a resonant tunnelling device in the on-state.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Oligomeric Interconnects

The oligomers, in the presently preferred embodiment, will be thiophene and thiophene-ethynylene oligomers of 100 Å in length (two 50A chains separated by a barrier-well-barrier structure). Thiophenes exhibit conductivities, in the bulk, of 100–200 $\Omega^{-1}cm^{-1}$. The ends of the oligomers will be functionalized with a thiol group on one end and a carboxyl groups on the other. Thiophene units can be readily deprotonated using bases like LDA, butyllithium, or alkyl-lithiums; hence, end group functionalization such as an organolithium can be easily accomplished. (Since lithium is at the top of the electropositivity scale, one can transmetalate to almost all other metals, or react with almost any electrophile. For example, a thiophene end group can be lithiated and converted to a (1) thiol for adhesion to Au surface, (2) for adhesion to Pd surfaces, (3) carboxylated for adhesion to oxide surfaces, (4) transmetalated and cross-coupled to bipyridyls for adhesion to Fe, etc.) The thiol group will selectively attach to a gold metal pad, and the carboxyl group to an aluminum pad, selectively for pad spacing of less than or equal to 100 Å. The pads will be defined by E-beam lithography and liftoff.

Synthesis of Controlled-Length Oligomers

In the presently preferred embodiment, thiophene units are used as the optimal organic subunits for controlled oligomer growth. This is because (1) oligo- or poly-thiophenes exhibit conductivities, in the bulk, of 100–200 $\Omega^{-1}cm^{-1}$, (2) The oligomers are air and light stable and they can be handled with no exotic precautions, (3) the alkyl groups afford materials that are freely soluble in organic solvents with no loss in the conductivities due to distortions in planarity of the contiguous p-backbone, and (4) thiophene units can be readily deprotonated using bases like LDA or butyllithium; hence, end group functionalization can be easily accomplished.

The synthesis of thiophene-ethynylene systems is expected to allow the rapid chain growth of conjugated oligomers (molecular wires). Simply, monomer will be converted to dimer, dimer to tetramer, tetramer to octamer, octamer to 16-mer, 16-mer to 32-mer, etc. In this way, there would be a rapid growth of the molecular chains. The synthetic route with the progress to date is shown in Scheme II.

Selective Attachment to Electrical Contact Pads

The present application provides an automatic attachment process, in which we take a conductive polymer, and attach ("functionalize") onto the ends a compound that can selectively attach to a metal probe. Numerous examples of these "self-assembling" compound/metal pairs are known; for example, n-alkanethiols onto Au, isonitrile onto Pt, and alkanecarboxylic acid onto aluminum oxide.[11] This is in essence a conducting string with sticky ends, which could bridge a gap between metallic contacts (of the selective metal). By fabricating (by E-beam or STM) closely-spaced metallic contacts, the molecular wire can be spontaneously deposited from solution. Note that if the molecular wire is synthesized with different end groups on opposing ends, the polarity of the attachment can be defmed. The specific contact resistance of such an ohmic contact is not yet precisely known, though the large value of the bond energies imply this may not be a problem; for the organic thiolates and Au, this is 40–45 kcal/mole. These "selective-attachment conducting polymers" (specifically, conjugated organic oligomers with functionalized selective attachment termini) provide a technique for spontaneously generating contacts between metallic endpoints, at the molecular scale (10–100 Å).

[11] See the paper by G. M. Whitesides and P. E. Laibinis at 6 LANGMUIR 87 (1990), which is hereby incorporated by reference.

An advantageous application is for simple self-aligned interconnects; given a device with metal A on one terminal (for example, collector), and a second device with metal B on one terminal (for example, base), a molecular wire with end groups A' and B' (which attach selectively to A and B, respectively) can bind selectively to make an interconnect, without a lithography step. Though we will see that interconnects are not the most important application, this spontaneous "lock-and-key" concept is the basic ingredient. Also note that this process is, to a degree, length dependent. Interconnections of contacts separated by longer than the designed molecular wire length are prevented. An important technology issue is the nuisance of unwanted binding of the polymers other than at the terminal ends. It appears that this concern can be solved for large metallic contacts (other than simple binding posts) by either selective exposure of the metal (i.e., in the simplest case by via holes) through an insulating overlayer coating at only the contact points desired, or by post-attachment scavenging of the unwanted dangling molecular wires.

Using synthesis similar to that outlined above, functional groups will be inserted into the conducting oligomer chain. An organic quantum well (more properly, quantum dots) with p- conjugated benzene rings and —O— barriers will be synthesized. A single thiophene unit would serve as the embedded quantum dot, cladded with —O— tunnel barriers. The thiophene unit will also be conjugated to another tunnel barrier, —S—, which forms the base. This barrier will have attached to it another thiophene unit, another barrier (—O—), and an oligomer chain with a functionalized end. Voltage input to the base via the conducting oligomer will modify the energy structure of the quantum well, thus modulating the current. Each of the 3 terminals (emitter with a thiol group, collector with a carboxyl group, and base with a diarylphosphine group) will attach spontaneously and selectively from solution to the metal pads (gold emitter, aluminum collector, and palladium base) in a unique configuration. This is a single molecule organic resonant tunneling (or Coulomb blockade) structure, with exact fabrication tolerance.

Optional Side Groups

The additional of a stabilizing side group, such as ethyl, can help to maintain the solubility of a large oligomer.

Option for Stabilizing Conductor Strands

One advantage of polythiophenes is that alkoxy (—OR) sidegroups (such as —OCH$_3$ or —OCH$_2$CH$_3$) add environmental stability to the polythiophene chain. Thus, use of such sidegroups may provide further advantages in the presently preferred embodiment.

To provide additional in situ stability, it is also possible to add side-groups which will have affinity for a known substrate. Thus, for example, if the polymer conductor is to connect two metal contacts across an oxide surface (e.g. SiO$_2$), a side group with a mild affinity for oxide can be added. An alkyl chain can be added without harming the conductivity of thiophenes, and a hydroxyl end group on the alkyl chain will form weak hydrogen bonding to the silicon dioxide.

Option for Fusing Conductor Strands

If one wanted small cross-linked packets of molecules that could bridge the gap between two surface, there remains the possibility of using the same self-assembly techniques. The metal surfaces would be made large enough that several hundred molecules could bridge the gap. Once the oligomeric units are bridging the gap and attached via the Z groups to the metal contacts, excess oligomers could be washed away. Then, the oligomers, upon exposure to an oxidant or Lewis acid (i.e. I$_2$ or FeCl$_3$), would probably cross-ink in place to form a semi-bulk-like material (which would still have a thickness only on the order of only a few hundred molecules thick). These extended oligomers are quite prone to such cross-linking upon mild acid exposure as described in Skotheim's "Handbook of Conducting Polymers" as well as in our "Macromolecules" reference above.

Device Embodiments

General Considerations

Unsuccessful Prior Designs

Up to now, researchers in organic device development have been pursuing embodiments of electron devices such as the so-called "Aviram switch".[12] In this conceptual specification, a delocalized conducting polymer chain has a non-conducting polymer fixed to it at 90° via a non-conjugated s-bonded network. This provides a simple crossbar switch. Such structures are now being realized; using similar methods as described above, two orthogonally fused oligomers (28 and 29) shown below were synthesized in the USC laboratory. Even these complex structure were freely soluble in organic solvents, due to the presence of alkyl groups at several of the thiophene units. Each of these structures have been suggested for future molecular electronic devices.[13]

[12] See the article by A. Aviram at 110 J.AM.CHEM.SOC. 5687 (1988), which is hereby incorporated by reference.
[13] See Tour et al., 112 J.AM.CHEM.SOC. 5662 (1990); Tour et al., 113 J.AM.CHEM.SOC. 7064 (1991); Aviram, 110 J.AM.CHEM.SOC. 5687 (1988); Hush et al., "Electron and Energy Transfer through Bridged Systems. 6. Molecular Switches: The Critical Field in Electric Field Activated Bistable Molecules", 112 J.AM.CHEM.SOC. 4192 (1990); Farazdel et al., "Electric Field Induced Intramolecular Electron Transfer in Spiro π-Electrol Systems and Their Suitability as Molecular Electronic Devices. A Theoretical Study", 112 J.AM.CHEM.SOC. 4206 (1990); all of which are hereby incorporated by reference.

In fact, the following orthogonally fused oligomers for an Aviram switch have actually been fabricated at the University of South Carolina:

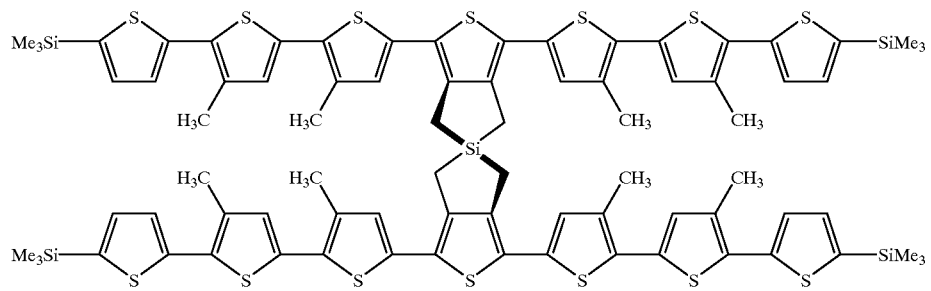

28

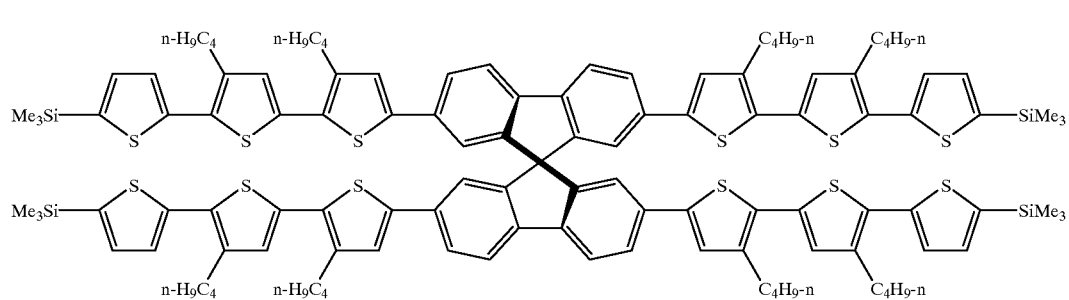

29

A straightforward application of the selective attachment technology described allows us to "tag" appropriately each of the termini. Four appropriately placed nanolithographic probes allow us to lay down the tagged molecule using a lock-and-key strategy, so that we can determine if such structures have the desired electronic properties; i.e., does an Aviram switch work, and does it have any gain?

The Aviram switch is one approach to realizing a molecular functional electron device. However, the present application discloses an alternative approach to realizing a molecular functional electron device that is a straightforward extension of the conducting oligomer work described above, and has an active region that has already been demonstrated (though only by optical characterization). Electrically, the approach is highly analogous to present solid state devices, and should provide a direct path to realizing useful electronic devices. Using synthesis similar to that outlined above, it has been demonstrated that functional groups can be inserted into the conducting oligomer chain of a simple wire to create complex bandgap engineered (in this case, molecular orbital engineered) structures, such as quantum wells or tunnel barriers. An example of a molecular quantum well is phthalocyanine,[14] which exhibits 4 quantum wells, with barrier heights of only a few 10s of $kT_{room}$.

[14] See S. Zecevic et al., "Spectroscopic and Electrochemical Studies of Transition Metal Tetrasulfonated Phthalocyanines, Part V. Voltammetric Studies of Adsorbed Tetrasulfonated Phthalocyanines (MTsPc) in Aqueous Solutions", 196 J.ELECTROAN.CHEM. 339 (1985), which is hereby incorporated by reference.

Very recently, organic quantum wells (more properly, quantum dots) with p-conjugated benzene rings and various barriers (—S—, —O—, and —CH$_2$—) have been reported.[15] Optical measurements exhibit shifts in the optical absorption peak corresponding to appropriately changing either the size of the "dot" (ie., changing the number of benzene units in the dot region) or the barrier height (using different barrier molecules). Thus, one can achieve the same type of bandgap engineered (here, molecular orbital engineered) electronic structures analogous to those that exist in quantum solid state heterojunction devices. Examples of the type of molecular tunnel barriers and quantum wells that have already been realized are illustrated in FIGS. 4A–4C.

[15] See T. Yoshimura et al., "Quantum wire and dot formation by chemical vapor deposition and molecular layer deposition of one-dimensional conjugated polymer", 60 APPL.PHYS.LEMT. 268 (1992), which is hereby incorporated by reference.

FIGS. 4A–4C show how the monomer components of a polymer can provide electronic operation analogous to solid state heterojunction quantum wells and tunnel barriers (see reference 18). The schematic conduction band (CB) and valence band (VB) are diagrammed.

According to the teachings of the present application, such organic molecular bandgap engineering is used to realize electronic structures by conjugating a selective-attachment wire to the designed quantum well active region; for example, the molecular equivalent of a resonant tunneling structure is achieved by conjugating the conducting oligomers onto the barrier ends of an organic quantum well (e.g., the example on the far right of FIGS. 4A–4C), then attaching this resultant molecule between nanofabricated contacts. This is a single molecule organic resonant tunneling (or Coulomb blockade) structure, with exact fabrication tolerance. The organic embodiment eliminates the problem of dimensional tolerance found in the heterojunction solid state version, since the synthesis in the molecular case is atomically discrete and unique, whereas self-limiting mechanisms are difficult to achieve in the solid state (i.e., the molecular approach achieves the goal of atomic layer epitaxy). Whether one has resonant tunneling or single electron charging depends on the details of the energy band (i.e., molecular orbital) structure; a priori, it would seem that high current density resonant tunneling would be preferable. It is expected that the large orbital energies will ensure room temperature operation. In the proposed structure, a single thiophene unit would serve as the embedded quantum dot, cladded with —O— or —S— tunnel barriers. Onto the barriers, the conducting oligomers with selective attachment ends would be conjugated. Modeling would help identify sufficiently low tunnel barriers for large current drive. To our knowledge, this approach to molecular quantum devices and the ability to fabricate selective contacts has neither been reported or proposed.

This two-terminal structure is a major milestone in this technology, as it combines the three key ingredients of the technology; 1) synthesis of conducting oligomers with selective attachment end groups; 2) conjugation of these oligomers onto a designed active region; and, 3) spontaneous attachment of a single molecule electron device onto nanofabricated contacts. This is an important intermediary diagnostic step toward achieving the final goal, three (or more) terminal organic transistors with gain. The fabrication of these transistors will require a non-trivial design of the "active region" molecule through modeling.

A molecular transistor that exhibits gain will have the same requirement that solid state electron devices have; that is, gain arising from modulation of non-equilibrium injected carriers by a second distribution of isolated carriers. In the molecular embodiment, it is quickly realized that the solid state analogies can no longer hold, since Coulomb blockade will not allow isolated controlling carriers to exist in the active region. However, there is an alternative, which has a demonstrated proof-of-principle (though so far only in optical embodiments). This alternative uses an active region structure that operates similar to a hot electron transistor (HET). The requirements would be that the quantum well active region (base), which can carry a large transport current density, be conjugated via s-bonds to a remote charge transfer molecule. The properties of this molecule is designed so that the base molecular orbital energy can change dependent on the charge state of the remote (a few bond lengths away) section of the molecule; i.e., gating via deformation of molecular orbitals.

Several methods are disclosed for coupling an input signal into the modulator side-chain of an oligomeric active device. The simplest connects the side-chain to an electrical contact. Another disclosed method uses a photosensitive compound to generate a voltage shift under illumination. Another disclosed method uses direct coupling of the modulator side-chain (the "base") of one active device to the output chain (the "collector") of another.

A common example of a molecule having photovoltaic properties is bacteriorhodopsin, which exhibits photoisomerization between two stable molecular orbital configurations. Specifically, incident light in a dye molecule produces a singlet excited state, which transfers an electron to a remote bacteriopheophytin molecule. In this case, the absorption level due to the molecular orbital reconfiguration changes by ~0.35 eV. (For a comparison to solid state systems, this level change is almost as great as the entire (direct gap) conduction band offset of a $GaAs/Al_xGa_{1-x}As$ quantum well).

Bacteriorhodopsin and rhodopsin are not themselves practical candidates for use with molecular electronic devices in a quasi-thin-film environment. However, many other classes of molecules provide useful photosynthetic reaction centers.[16] Some attractive candidate species are listed by Pieroni in 114 J.A.C.S. 2734 (1992),[17] and by J.-M. Lehn, 1991 J.CHEM.SOC. 1179, both of which are hereby incorporated by reference.

[16]See generally the Tachibana article in 1992 CHEM.LETT. 173, and the review article by R. R. Birge in 41 ANNU.REV.PHYS.CHEM. 683 (1990), both of which are hereby incorporated by reference.

[17]The references cited in this article also merit review, and are also hereby incorporated by reference.

Choice of Oligomeric Conductor

Thiophene is the preferred conductor. Thiophene has been demonstrated to provide adequate conductivity and stability, and also permits convenient modification with sidegroups and endgroups as detailed elsewhere herein. However, alternative conductive oligomers can be used if they provide adequate conductivity and stability.

In general, the thiophene monomeric units provide their best conductivity between ring positions 2 and 5 (the two positions adjacent to the sulfur atom). Thus, the specific examples given below use this configuration. Adjacent thiophene monomers preferably have opposite (but approximately coplanar) orientations. This permits the oligomer to take a more extended trans-oid configuration.[18]

[18]By contrast, if adjacent thiophene monomers have a more nearly parallel (and approximately coplanar) orientation, the oligomer will take up the coiled cis-oid configuration.

Barrier Design at Modulator Input

FIGS. 5A and 5B are a corresponding pair of drawings of two states of operation of a novel molecular electronic device.

FIG. 5A shows the ON state. In this state an energy level in the well region is aligned with the energy level of incoming electrons, and thus resonant tunnelling can occur, to produce a net flow of electrons from the "emitter" terminal through to the "collector" terminal.

FIG. 5B shows the OFF state. In this state a different potential has been induced at the "base" terminal. This induced potential propagates, through the chain X, to change to energy levels in the well region. As a result of this change, no energy level in the well region is aligned with the energy level of incoming electrons, and thus resonant tunnelling does not occur, and therefore current flow does not occur between the "emitter" terminal and the "collector" terminal.

Figure 6:
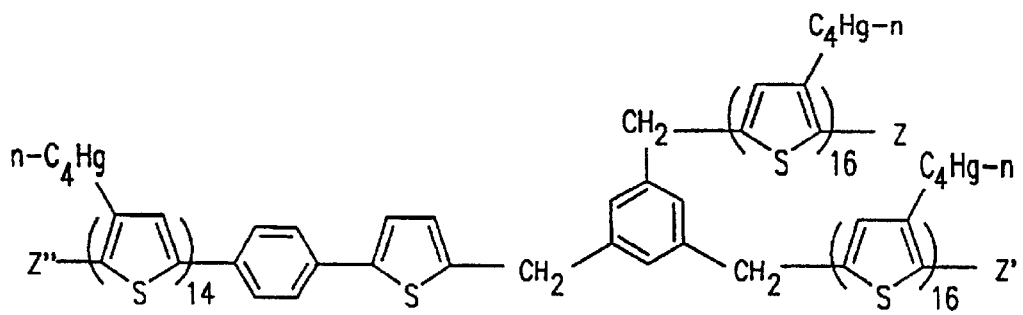
FIG. 6 shows a sample structure for realizing the coupling between the modulator side chain and the energy levels of a well in the conductive polymer chain.
Figure 7A:
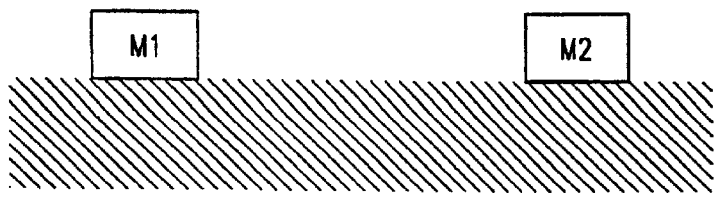
FIGS. 7A, 7B, and 7C show a sequence of steps to produce self-aligned deposition from solution of selective contacts between oligomer ends and metal contact pads.
Figure 7B:
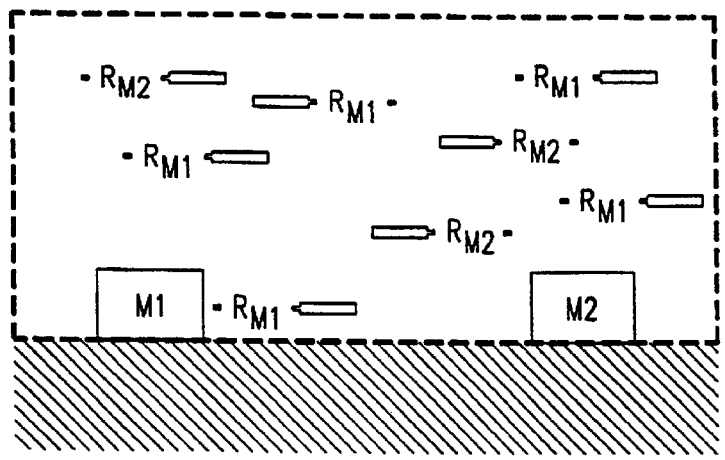
Figure 7C:
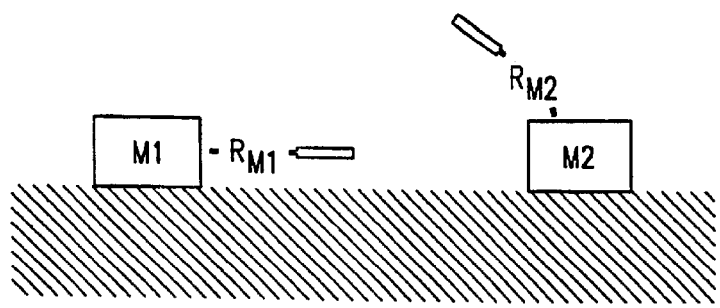
Figure 8A:
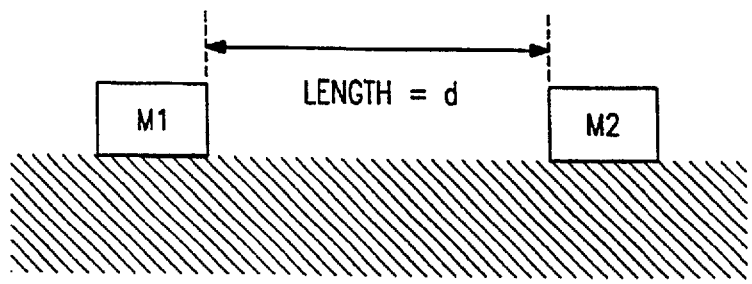
FIGS. 8A, 8B, and 8C show a sequence of steps to produce length-selective deposition from solution of only those conductive oligomers which have a predetermined length L.
Figure 8B:
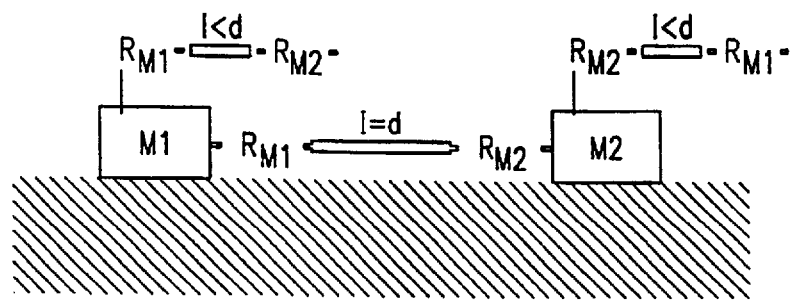
Figure 8C:
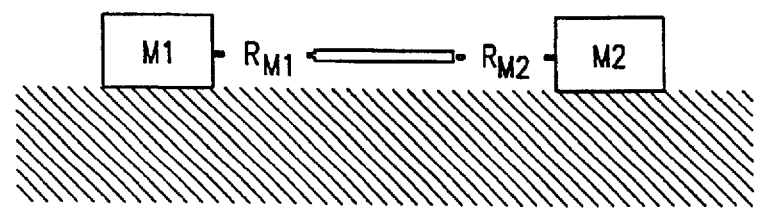
Figure 9:
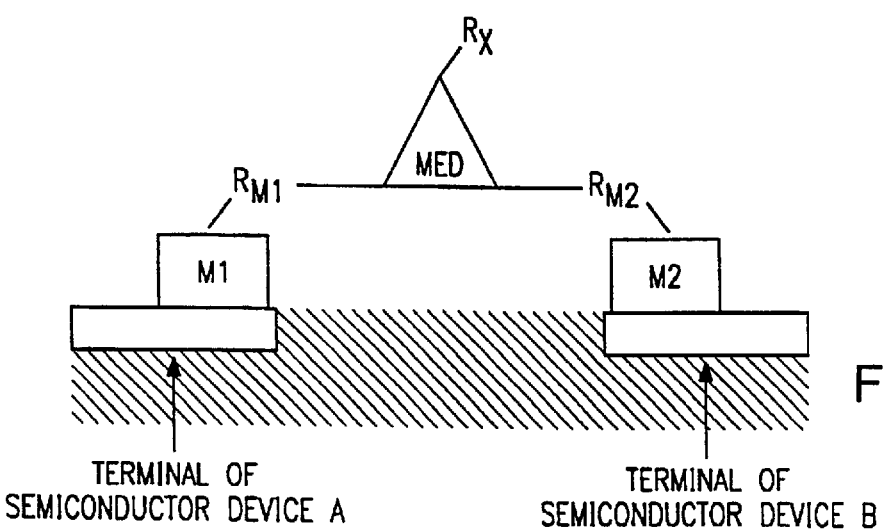
FIG. 9 shows how a molecular electronic active device is interconnected with semiconductor devices, using first and second metal contact pads M1 and M2.

FIG. 6 shows a sample structure for realizing the coupling between the modulator side chain and the energy levels of a well in the conductive polymer chain.

The trisubstituted emitter/collector/base unit can be prepared as follows. The central 1,3,5-benzenetrimethanol is a known compound[19] and can serve as the junction or "W" unit represented in FIGS. 5A and 5B. Treatment with excess p-toluenesulfonyl chloride ("TsCl" or "tosyl chloride") in pyridine would rapidly afford the 1,3,5-benzenetris (hydroxymethylenetosylate). An oligothiophene of 16 units with a metal binding group Z (see below for a description of Z) and n-butyl groups attached would be fully soluble based on our previous experience with thiophene oligomer synthesis[20]. Treatment of the thiophene oligomer with LDA would afford the terminal thiophene anion which could be reacted with an excess of the 1,3,5-benzenetris (hydroxymethylenetosylate) to form the monosubstituted core. Likewise, treatment of the monosubstituted core with a second oligomer anion containing the same or a different metal binding group Z' would afford the disubstituted core. Undoubtedly, a separation would be needed here; however, sterics interactions of the incoming nucleophile should favor the formation of the disubstituted core shown. Again treatment of the disubstituted core with a third oligomeric anion containing the same or a different metal binding group Z" would afford the desired trisubstituted emitter/collector/base unit shown. The methylene units (CH$_2$ groups) serve as the large barrier units. The phenyl group serves as the low barrier unit. It is well-known that conversion of a benzenoid structure to the quinoidal form for conduction is far more difficult than conversion of the thiophene units to their corresponding quinoidal forms. This trend is easily seen in the band-gap differences for polyphenylene and polythiophene at 3.2 eV and 1.9 eV, respectively[21].

[19]See CHEM. ABSTR. #82:125625g, which is hereby incorporated by reference.
[20]See Tour and Wu, in MACROMOLECULES 1992, 25, 1901; Tour et al. in J.AM.CHEM.SOC. 1991, 113, 7065; Tour et al. in J.AM.CHEM.SOC. 1990, 112, 5662; all of which are hereby incorporated by reference.
[21]See the paper by Bott, Service, and Winter in CHEM. BRITAIN, May 1992.

The Z groups would be metal binding groups such as protected carboxyl, protected thiol, phosphine, or bipyridyl group. The protection groups would be base-stable and would be removed at the final step off the reaction. For numerous functional protecting groups, see "Protective Groups in Organic Synthesis" 2nd Edition by Greene, T. W. and Wuts, P. G. M.; Wiley: N.Y., 1991.

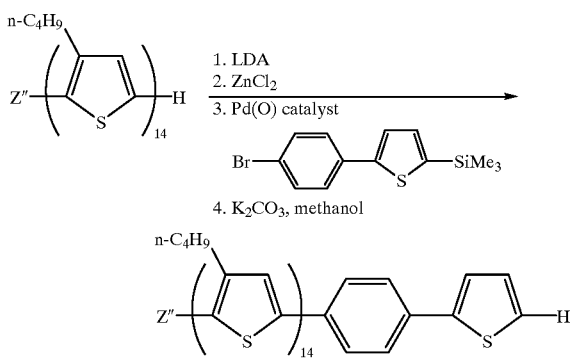

The thiophene oligomers could be synthesized according to methods described previously for soluble thiophene oligomer synthesis. The one chain containing the thiophene/phenylene unit could be synthesized as shown below. These metal-atalyzed coupling are quite standard in organic synthesis and our three previous papers listed above outline these procedures. Note that "Me" stands for methyl of $CH_3$ group. Similarly, the thiophene-phenylene dimer could be prepared as follows.

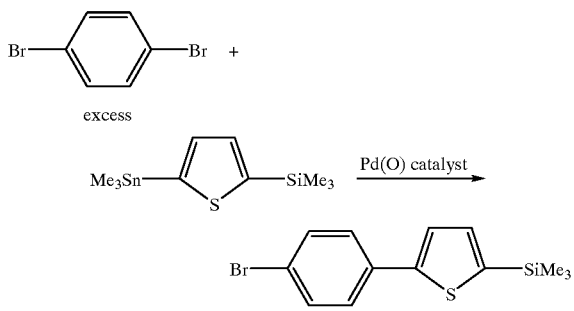

Choice of Modulation Input Source

Figure 13C:
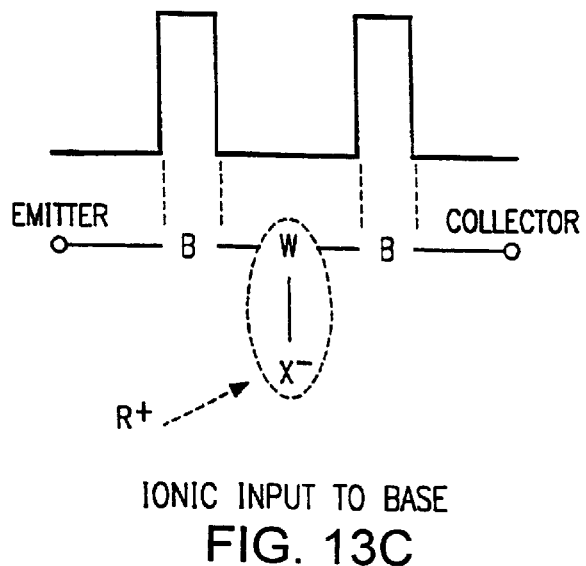

Several methods are disclosed for coupling an input signal into the modulator side-chain of an oligomeric active device. The simplest connects the side-chain to an electrical contact. Another disclosed method uses a photosensitive compound to generate a voltage shift under illumination. Another disclosed method uses direct coupling of the modulator side-chain (the "base") of one active device to the output chain (the "collector") of another. Yet another disclosed method uses ion pumping in a confined gel (as schematically shown in FIG. 13C, to effect an ionic coupling of the modulator side-chain (the "base") of one active device to the output chain (the "collector") of another.

Off-State Impedance

For some applications, a driving need is to modulate the device current down to zero in the off state. For such applications, the device is preferably modified to include multiple modulated gain stages in series. This can be imple mented as a molecular structure which includes a barrier-well-barrier-well-barrier structure. A Tunnelling Versus Hopping Operation The electronic transport mechanisms for quantum-sized systems with tunnel barriers are either; a) tunneling through localized states (i.e., resonant tunneling), or; b) hopping (with attendant issues of Coulomb blockade); or, c) a combination of both.

Figure 2A:
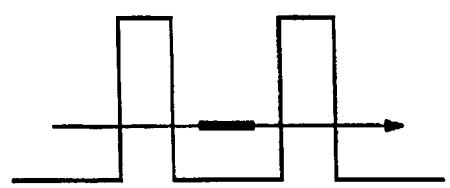
FIG. 2A shows a resonant tunnelling device in the on-state.
Figure 2B:
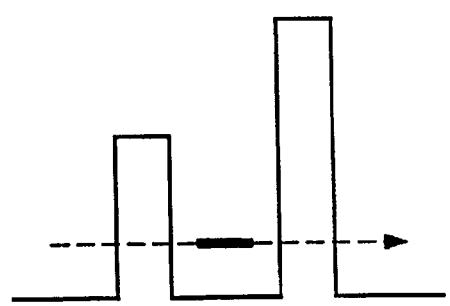
FIG. 2B shows the device of FIG. 2A in the off-state (after wave-function modulation has changed the height of the second barrier).

Resonant tunneling (as schematically shown in FIGS. 2A–2C) is a conduction mechanism which depends on quantum mechanical tunneling through a quasi-bound quantum-confirmed state. The simplest embodiment is a quantum well cladded by thin tunnel barriers. Electrons from the emitter of such a structure tunnel through the first barrier into the central well region, and then quickly tunnel out. If the central quantum state is made to be energetically misaligned with the incoming emitter electrons, such as by a base potential applied to the central quantum well, the current is dramatically reduced. By this mechanism, a transistor with gain can be produced. Such embodiments have been extensively demonstrated in semiconductor devices, but not in molecular electronic structures.

Figure 3A:
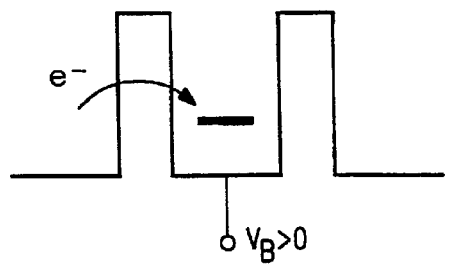
FIG. 3A shows an electron-hopping device with its well empty.
Figure 3B:
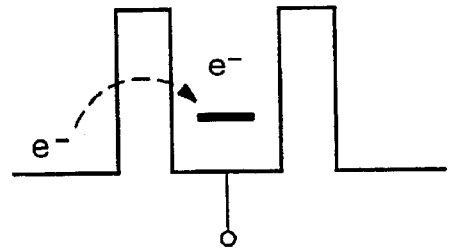
FIG. 3B shows how, if the well of the device of FIG. 3A contains an excess electron, the likelihood of another electron hopping into that well is greatly reduced by the "Coulomb blockade" effect.
Figure 3C:
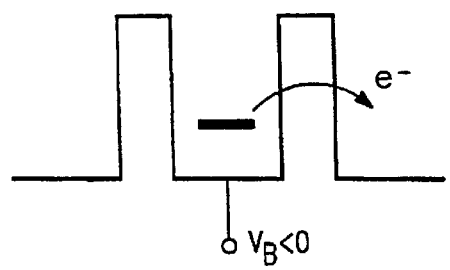
FIG. 3C shows how, if the well of the device of FIG. 3A contains an excess electron, that electron can hop out of the well.
Figure 3D:
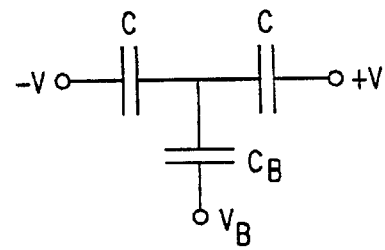
FIG. 3D shows a macroscopic-quasi-equivalent circuit diagram of the device of FIG. 3A.

Hopping, or Coulomb blockade, is a different conduction mechanism, wherein the structure can be thought of as a series of small capacitors. If the structure is sufficiently small, the charging energy of the capacitor, $Ec=e^2/2\ C$, can be so large that it is energetically unfavorable for 2 or more electrons to be on the central terminal; thus, a single electron at a time "hops" through the structure. FIGS. 3A–3C schematically show this mode of operation, and FIG. 3D shows the corresponding electrical model.

The hopping mechanism is differentiated from resonant tunneling mainly by current density; if the collector barrier is sufficiently thin, electrons quickly tunnel through the structure, so Coulomb blockade never has a chance to take effect; thus, resonant tunneling is the mechanism. If the collector barrier is thick and/or high, the electron resides in the central region for a long time, and thus Coulomb blockade occurs.

The advantage of resonant tunneling is that high current density and large gain are possible. In Coulomb blockade, the ultimate limit of an electron device (ie., a single electron device), the current density is low, and it is as yet unclear that large gain can be achieved in such a device.

First Preferred Device Embodiment

This sample embodiment provides selective attachment of organic wires.

The oligomers will be thiophene and thiophene-ethynylene oligomers of 100 Å in length. Thiophenes exhibit conductivities, in the bulk, of 100–200 $\Omega^{-1}cm^{-1}$. The ends of the oligomers will be functionalized with a thiol group on one end and a carboxyl groups on the other. Thiophene units can be readily deprotonated using bases like LDA, butyllithium, or alkyllithiums; hence, end group functionalization such as an organolithium can be easily accomplished. (Since lithium is at the top of the electropositivity scale, one can transmetalate to almost all other metals, or react with almost any electrophile. For example, a thiophene end group can be lithiated and converted to a (1) thiol for adhesion to Au surface, (2) for adhesion to Pd surfaces, (3) carboxylated for adhesion to oxide surfaces, (4) transmetalated and cross-coupled to bipyridyls for adhesion to Fe, etc.) The thiol group will selectively attach to a gold metal pad, and the carboxyl group to an aluminum pad, selectively for pad spacing of less than or equal to 100 Å. The pads will be defined by E-beam lithography and liftoff.

Second Preferred Device Embodiment

This second sample embodiment provides a molecular active device which employs resonant tunneling.

Using synthesis similar to that outlined above, functional groups will be inserted into the conducting oligomer chain.

An organic quantum well (more properly, quantum dots) with p-conjugated benzene rings and —O— barriers will be synthesized. A single thiophene unit would serve as the embedded quantum dot, cladded with —O— tunnel barriers. The thiophene unit will also be conjugated to another tunnel barrier, —S—, which forms the base. This barrier will have attached to it another thiophene unit, another barrier (—O—), and an oligomer chain with a functionalized end. Voltage input to the base via the conducting oligomer will modify the energy structure of the quantum well, thus modulating the current. Each of the 3 terminals (emitter with a thiol group, collector with a carboxyl group, and base with a diarylphosphine group) will attach spontaneously and selectively from solution to the metal pads (gold emitter, aluminum collector, and palladium base) in a unique configuration. This is a single molecule organic resonant tunneling (or Coulomb blockade) structure, with exact fabrication tolerance.

Third Preferred Device Embodiment

This sample embodiment provides a molecular resonant tunneling device which can be activated by optical input.

Using synthesis methods similar to that outlined above, functional groups are inserted into the conducting oligomer chain. An organic quantum well (more properly, quantum dots) with conjugated benzene rings and —O— barriers will be synthesized. A single thiophene unit would serve as the embedded quantum dot, cladded with —O— tunnel barriers. The thiophene unit will also be conjugated to another tunnel barrier, —S—, which forms the base. This barrier will have attached to it another thiophene unit, another barrier (—O—), and a dye molecule such as bacteriorhodopsin. Photon input to the base will transfer an electron to the base thiophene unit, which will modify the energy structure of the quantum well, thus modulating the current. Only 2 terminals (emitter with a thiol group, collector with a carboxyl group) will attach spontaneously and selectively from solution to the metal pads (gold emitter, aluminum collector) in a unique configuration. The base will hang freely.

Module Embodiments

Assembly of the disclosed molecular electronic devices into a complete integrated circuit bears some significant differences from the assembly and packaging of a conventional semiconductor integrated circuit.

Combination of Molecular and Semiconductor Active Devices

A major problem for most proposed nanoscale device technologies is fanout; there will always be a need for intermediate current drive (amplifiers) in few-electron systems. The solution is easy to incorporate in this technology. A conventional transistor amplifier layer would be the starting substrate. After coating with an insulating layer, the metal interconnect and molecular layers are fabricated on top, with input to the amplifiers made by via holes (for example, the post in FIG. 12). This allows one to derive or input an internal signal anywhere in the array.

Self-Aligned Processes for Preparing Metal Contacts with Nano-Scale Separation

In such a hybrid structure, one important consideration is how to prepare contacts, within a semiconductor fabrication process, which will have small enough dimensions to take advantage of the very small scale of the molecular devices. One option for doing this is E-beam direct write, and a probably long-term alternative is masked ion beam lithography.

However, it can also be advantageous to prepare gaps which have sublithographic spacing. The following process flow is an example of a self-aligned process for achieveing this.

Figure 1B:
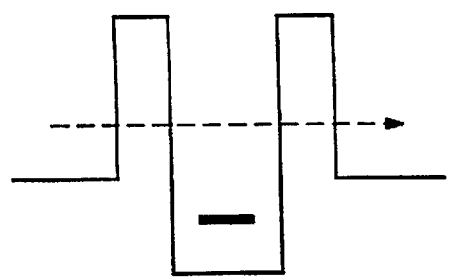
FIG. 1B shows the device of FIG. 1A in the off-state (after the potential of the base has been shifted).
Figure 14A:
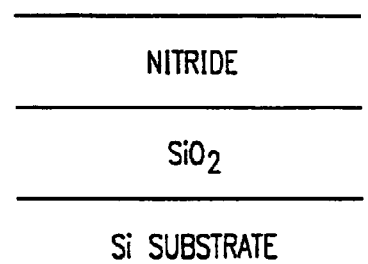
Figure 14B:
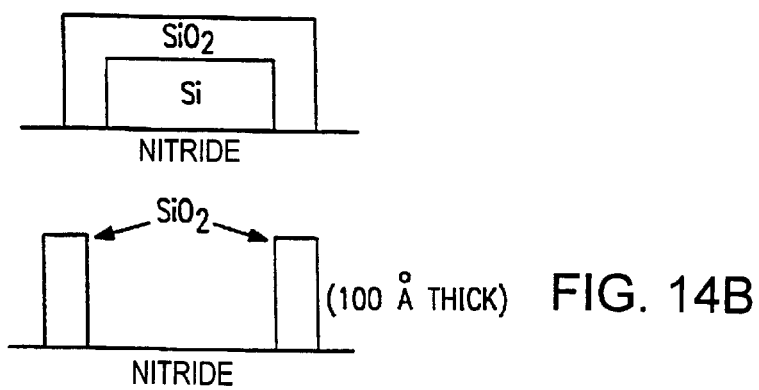
Figure 14C:
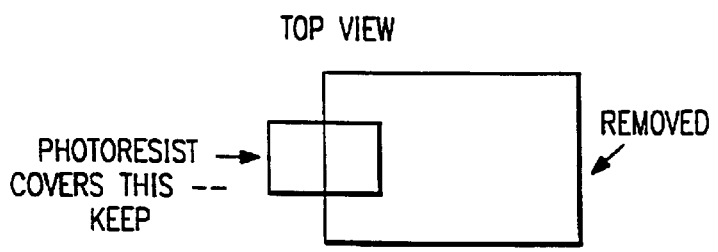

1) (See FIG. 14A) Start with Si substrate; oxidize (thick) $SiO_2$ layer; put on nitride layer.
2) (See FIG. 14B) define "thin sidewall" by
   i) CVD Si
   ii) pattern small Si squares
   iii) recrystallize Si (if necessary)
   iv) 100 Å $SiO_2$ anneal
   v) ion etch briefly (~150 Å)
   vi) RIE Si
3) (See FIG. 14C) remove sidewall except for 1 side (photoresist & $SiO_2$ etch)
4) (See FIG. 14D1) Define contact pads (optical); evaporate metals 1 and 2
5) Etch $SiO_2$—lifts off metal to create a 100 Å break.
6) (See FIG. 14E1) Do same "sidewall" trick to create a 100 Å wall across pads
7) (See FIG. 14F1) evaporate some insulator (e.g. $CaF_2$); etch $SiO_2$ (lift off $CaF_2$); left with exposed metal
8) Add the polymers.

This process can also be varied with alternative steps as follows:

4') (See FIG. 14D2) Pattern nitride in the following configuration (using optical photoresist and plasma etch):
5') (See FIG. 14E2)
   i) Spin on Photoresist ("PR")
   ii) Partially etch the PR in an $O_2$ plasma until the $SiO_2$ ridge sticks up.
   iii) Etch $SiO_2$ (under RIE conditions)
   iv) Etch $SiO_2$ with undercut (e.g. wet etch)
   v) Strip PR. These steps have produced a nitride bridge.
6') (See FIG. 14F2) Now evaporate metals 1 and 2 at different angles. The angle deposition provides a reduction of the $1\mu$ gap to about 100 Å (depending on the specific thicknesses and angles used).

Active Device Types

The preferred active device architecture is as shown in FIGS. 5A and 5B. However, the alternative principles of FIGS. 2 or 3 may alternatively be applied instead.

The semiconductor active devices are preferably MOSFETs, for their high input impedance and low power draw. Of course, these are preferably combined with conventional ESD diodes at I/O connections.

Passivation

Of course, the completed module is hermetically sealed from atmospheric oxygen. The simplest way to do this is with a bubble seal which encloses an inert atmosphere (nitrogen or argon). A simple epoxy seal will do a good job of this.

Alternatively, a passivation layer over the active devices is used to scavenge any small amounts of oxidant from the sealed environment.

Examples of Novel Circuit Implementations

Assuming that we can create active devices with "tagged" terminals, we only need to (nanolithographically) define a connection pattern as the first step. We do not assume any specific nanolithographic tool (although it is preferable that such a step will be parallel, such as MIBL, X-ray, or masked E-beam). This initial step defines an aligning matrix for the molecules. We then attach (from solution) the synthesized device(s), in a lock-and-key strategy. Let us consider how to create simple gates. In some cases, we can work with just one "polarity" of tagging. For example, a NOR gate would only need a single polarity, as shown in FIG. 11. Here the organic transistor terminals (collector, emitter, and base; or, C, E, B) are tagged with selective attachment to metals M1, M2, and M3, respectively. After fabrication of the metals in the diagrammed pattern, the tagged molecule spontaneously and selectively arrange to form the gate as shown.

NOR Gate

FIG. 11 is a schematic of a molecular NOR gate. The shaded areas are the initially defined metals M1, M2, and M3. The triangles represent the spontaneously assembled molecular transistors. For this gate, the polarity of the tagging is {E:M2}, {B:M3}, and {C:M1}, where E=emitter, B=base, C=collector. The output can either be metal wire or a M1 tagged oligomer.

For complex designs, the metal (or otherwise) attachment pads need not be connected externally, and can serve as binding post attachment posts for transistor-transistor "soldering", as illustrated in FIG. 12, which is a schematic of a molecular binding post arrangement, for arbitrary {E,B,C} connections. The shaded area is metal M1, and the triangles represent the molecular transistors with attachment ends L1.

This allows us to define a topology, unaligned (indeed, as the initial step), of active device interconnections without external contacts. Some more complex circuits will require a number of different polarities and types of active elements. The fabrication for such a system would require sequential spontaneous absorptions of each type, from solution. The only constraint is that each polarity have a unique contact geometry, and that each successive step does not disturb the subsequent stages (i.e., process integration. While this is clearly not a trivial engineering feat, there are no fundamental limitations yet identified.) Thus, the circuit configuration is determined in the reverse order than that of conventional fabrication; the active devices spontaneously self-assemble onto the interconnects. Note that the interconnects that run long distance are few; most are simply attachment sites to connect emitter to base, etc.; thus, metal interconnects will not define the lower limit of device scaling, with a design that mixes metal and conductive oligomer contacts. This approach appears to optimally pack devices.

Multi-Input (Quasi-Analog) Gates

By including multiple modulator chains at separate inputs on a conductor chain, conductivity can be modulated independently by several separate inputs. Such quasi-analog gates may be useful for applications such as pattern recognition.

Novel System Applications

The device and circuits described lend themselves well to systems in which an array of molecular circuits can advantageously be formed, in a wholly self-aligned manner, by a sequence of batch-processed steps.

Clock Distribution

A significant issue for any large integrated system is clock distribution and skew. As was previously discussed, there exists a class of photoisomerization molecules which could be directly utilized here. At nodes where one wishes to distribute a global clock that cannot be distributed by the underlying amplifier array, a photosensitive electron transfer molecule would be attached to the base, thus supplying an optically generated clock with no skew. The ability to conjugate a variety of different photosensitive electron transfer molecules on the same basic transistor structure could provide the capability of a multiphase clock.

Large Neural Networks

Neural networks are an extremely attractive technology which has attracted increasing interest over the last 30 years. A great advantage of the neural network architecture is that it is not necessary to directly specify every connection, nor to have direct access to every stored bit of data. However, this imposes a correlative difficulty in scaling to large sizes: the peripheral access circuits become less closely coupled to the "interior" of a neural net as the size of the array increases.

The disclosed novel architectures, by providing self-assembling electronic devices with electrical access available at any point, offer the potential to provide a large advance in neural network architectures.

Holographic Storage

The disclosed innovative technology provides a new way to economically fabricate arrays with very high density. Therefore, one particularly attractive application is in direct or internal addressing of holographic memory.

Holographic memory exhibits many attractive characteristics, but its difficulties have prevented it from making any serious threat to become other than marginal. One contribution potentially available from the disclosed inventions is to permit direct access to modify or overlay holographically-organized date.

Sample Processing Sequence

We now outline the detailed synthetic organometallic approach to realizing these conjugated organic oligomers. The oligomers will be well-defined, homogeneous materials that are fully characterized from the structural standpoint. No range of molecular weight compounds or molecular lengths will exist. These will be chemically pure (>97%) materials (initially thiophene and thiophene-ethynylene oligomers), of lengths that can be determined to ~0.5 Å. The oligomers will range from 10 Å to at least 100 Å in length. In the undoped form, they will be air and light stable for at least 24 hours, and stable for months or years in an inert ($N_2$) atmosphere in the absence of light.

The ends of the oligomers will be appropriately functionalized with various organic groups that are known to adhere to specific nanolithographic probe surfaces. These functionalities may be thought of as molecular "alligator clips". Once these functionalized oligomers are synthesized, we can electrically characterize a single molecular oligomer by "stringing" it between nanofabricated ~100 Å spacing metal contacts. Simultaneously, we can structurally characterize the adhered oligomer, in situ, by STM. At present, conjugated oligomers with maximum lengths of ~50 Å have been fabricated. These lengths need to be extended to ~100 Å to coincide with long term nanolithographic requirements. Thus, the synthesis effort will have two parallel paths; extend the conjugated oligomer length to 100 Å; and conjugate selective attachment structures onto existing, shorter lengths to gain synthesis experience of compatibility of processes.

Candidate attachment end groups are thiol, carboxyl, pyridyl, or phosphine groups. The electronic properties of the attachment structures are key to the synthesis direction. The fabrication/characterization effort simultaneously will be characterizing the attachment end groups, by attachment onto nanofabricated structures, and subsequent STM. These results will provide information about the binding energies and properties of the various proposed attachment structures.

The synthesis of homogeneous conjugated oligomers beyond 50 Å in length has never before been accomplished. Two groups recently reported the formation of 40 Å oligomers; however, there were two primary deficiencies in those systems that would make it difficult for their incorporation into nanolithographic architectures.[22] First, the conjugated polyolefins are not stable to air and light at ambient temperatures for even short time periods (<30 min half lives). Second, and even more importantly, the syntheses do not lend themselves to the preparation terminally functionalized oligomers which are necessary if the molecules are to bind to probe surfaces. The group of Prof. J. Tour recently described the synthesis of thiophene oligomers from 3 Å to 30 Å. The synthesis and reagents necessary for the synthesis are shown as follows in Scheme I.[23]

15–19, 1991, St. Thomas, USVI (unpublished), which is hereby incorporated by reference. There was one report of a 75 Å molecular wire (P. W. Kenny and L. L. Miller, "Synthesis of Molecular Lines, Rigid Linear Molecules with Nanometer Scale Dimensions", 84 J. CHEM. SOC. CHEM. COMMUN. 1988); however, the many amide linkages along the backbone would probably be an electron sink. Specifically, a conducting backbone was not utilized.

[22]See the paper by M. Blanchard-Desce, presented at THE 2ND INTERNATIONAL CONFERENCE ON MOLECULAR ELECTRONICS—SCIENCE AND TECHNOLOGY, Dec.

[23]See J.Tour and R. Wu, MACROMOLECULES 1992, which is hereby incorporated by reference.

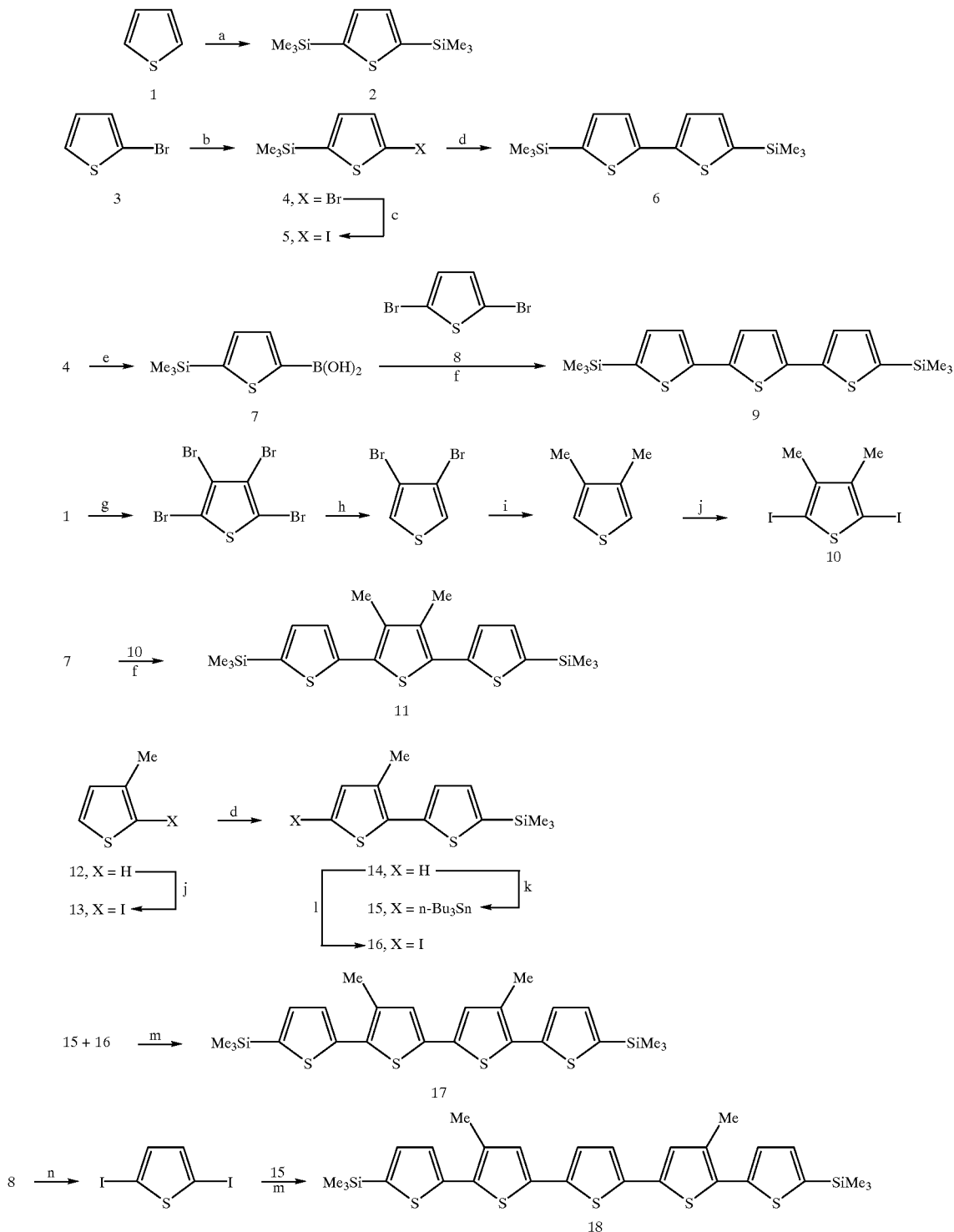

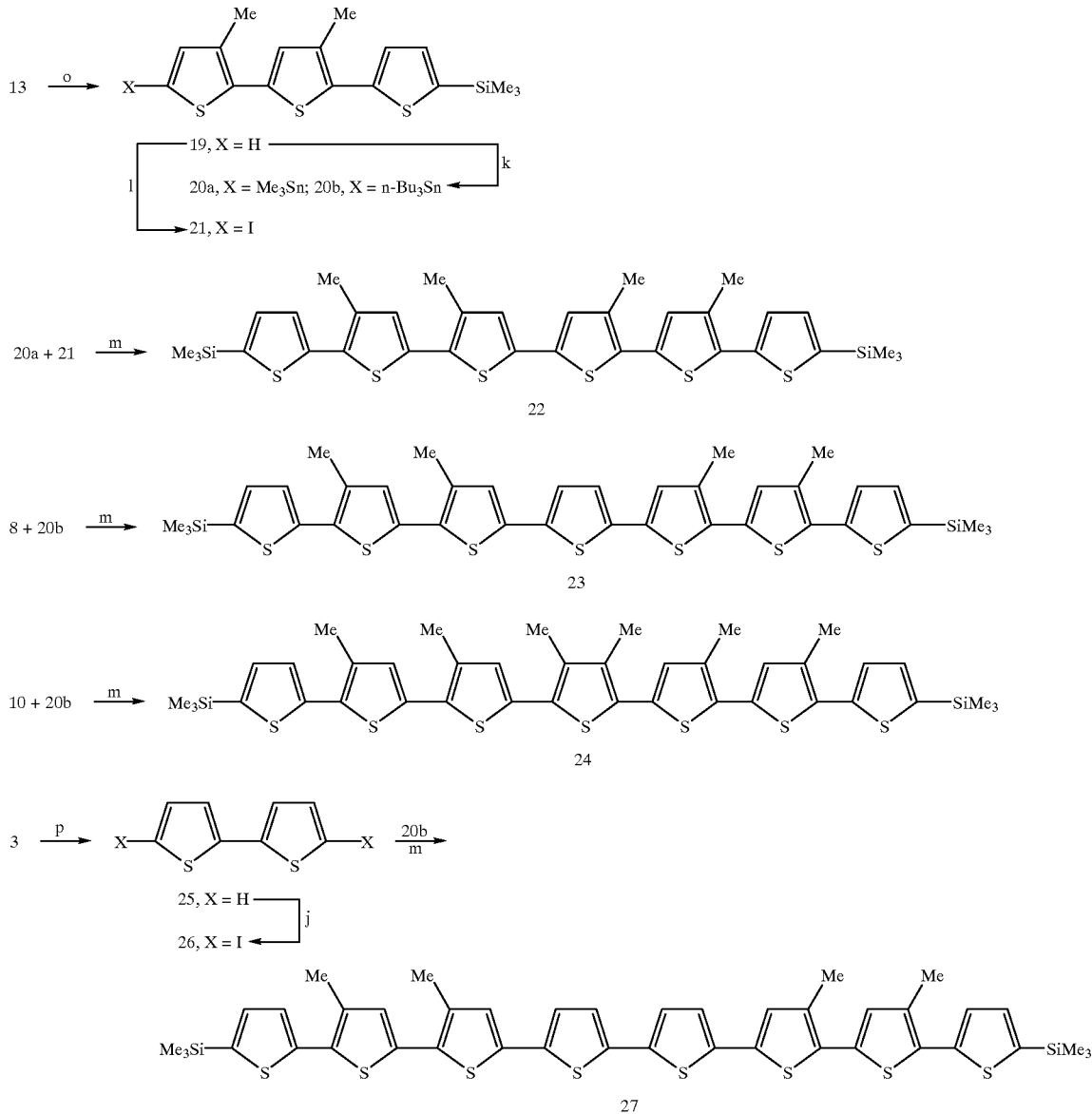

In this process schema, the reagents are:

(a) n-BuLi, TAMED[24]; TMSCl[25]
(b) LDA[26]; TMSCl
(c) n-BuLi; $I_2$
(d) Mg; 5, $Cl_2Ni(dppp^{27})$
(e) t-BuLi; B(O-i-Pr)3; $H_3O+$
(f) $Pd(PPh_3)_4$, $Na_2CO_3$, $H_2O$
(g) $Br_2$
(h) n-BuLi; $H_2O$
(i) MeMgBr, $Cl_2Ni$ (dppp)
(j) HgO, $I_2$
(k) LDA; $R_3SnCl^{28}$
(l) LDA; $I_2$
(m) $Pd(PPh_3)_4$, toluene
(n) t-BuLi; $I_2$
(o) Mg; 16, $Cl_2Ni(dppp)$
(p) Mg; 3, $Cl_2Ni(dppp)$.

[24] This is a conventional abbreviation for N,N,N',N'-tetramethylethylenediamine.
[25] This is a conventional abbreviation for chlorotrimethylsilane.
[26] This is a conventional abbreviation for lithium diisopropylamide.
[27] This is a conventional abbreviation for diphenylphosphinopropane.
[28] The radical R can be, for example, $CH_3$ or $n-C_4H_9$.

In the presently preferred embodiment, thiophene units are the optimal organic subunits for controlled oligomer growth. This is because (1) oligo- or poly-thiophenes exhibit conductivities, in the bulk, of 100–200 $\Omega^{-1}cm^{-1}$, (2) The oligomers are air and light stable and they can be handled with no exotic precautions, (3) the alkyl groups afford materials that are freely soluble in organic solvents with no loss in the conductivities due to distortions in planarity of the contiguous p-backbone, and (4) thiophene units can be readily deprotonated using bases like LDA or butyllithium; hence, end group functionalization can be easily accomplished.

Scheme I shows how trimethylsilyl groups have been demonstrated in use to cap the ends of thiophene oligomers.

The trimethylsilyl groups allowed control of the oligomer growth at each stage in the synthesis, and may provide a handle for future chemoselective modifications.[29]

[29]See T. H. Chan and I. Fleming, SYNTHESIS 1979, 761, which is hereby incorporated by reference.

The synthesis of thiophene-ethynylene systems is expected to allow the rapid chain growth of conjugated oligomers (molecular wires). Simply, monomer will be converted to dimer, dimer to tetramer, tetramer to octamer, octamer to 16-mer, 16-mer to 32-mer, etc. In this way, there would be a rapid growth of the molecular chains. The synthetic route with the progress to date is shown in Scheme II.

continue this approach to rapidly grow the molecular wires with doubling length at each consecutive coupling. Note that each coupling step utilized only a catalytic amount of palladium and copper and excesses of base were used to satisfy the hydroxyl deprotonation as well as the thiophene deprotonations. The next coupling will provide the octamer, followed by the 16-mer, etc. However, if one wanted a chain of 24-mer in length, coupling of a 16-mer with an octamer could analogously be accomplished. The hydroxyl functionalities provide a handle for simple purification; however, if desired, they could easily be blocked protected as the TBDMS ether) to prevent possible bonding to the lithographic surface. Hence, we have rapidly constructed

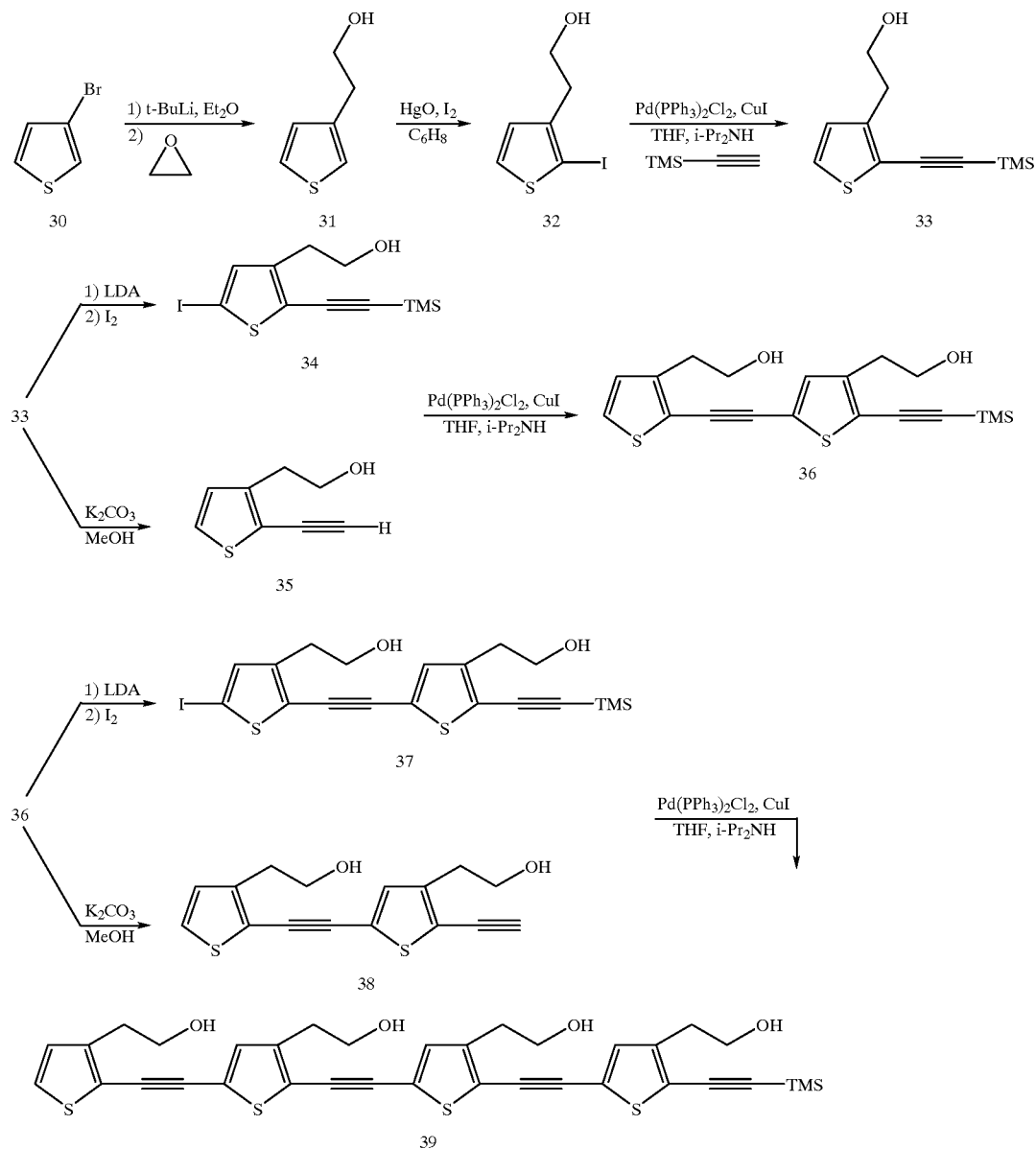

We have presently completed the synthesis of the tetramer 39. Notice that the monomer 33 was converted to the activated systems 34 and 35, and then coupled to form the dimer 36. Analogously, the dimer 36 was activated to 37 and 38, and then coupled to form the tetramer 39. We hope to molecular wires and we have demonstrated a method to extend molecular chain length rapidly and efficiently. Thus, we have demonstrated that, from the synthetic standpoint, thiophene-based chains are the optimal chains to use for molecular wire synthesis. Moreover, Scheme II outlined a method to rapidly build molecular chains so that successive monomer utilization is not necessary.

There are two initial synthesis objectives: Functionalize "alligator clip" termini for adhesion of a single molecular chain to nano-lithographic probes. The beauty of the thiophene and ethynylene methodology becomes immediately apparent. Thiophenes and alkynes can be easily deprotonated with strong lithium bases such as LDA or alkyllithiums. Thus an organolithium can be obtained. Since lithium is at the top of the electropositivity scale, we can transmetalate to almost all other metals, or react with almost any electrophile.[30] For example, a thiophene end group can be lithiated and converted to a (1) thiol for adhesion to Au surface, (2) diarylphosphine for adhesion to Pd surfaces, (3) carboxylated for adhesion to oxide surfaces, (4) transmetalated and cross-coupled to bipyridyls for adhesion to Fe, etc. (see Scheme III below). Note that the same thing could be done for the alkyne terminated ends. Moreover, through nickel and palladium-catalyzed cross-couplings, these units could be introduced at the outset of the synthetic sequence, or at the last step. The introduction of these units at the last step would certainly prove to be more advantageous since simple modification to an existing chain would permit the affixing of a variety of end functionalities. Moreover, the ends of the chains in the thiophene-ethynylene systems (i.e. structure 39 in Scheme II) allow selective differentiation of the two ends. In this way, we could have, for example, one thiol cap and one phosphine cap. Deactivation of the palladium catalyst by the thiol would be avoided by protection of the thiol as the t-butylthioether followed by Hg(OAc)$_2$ removal at the final stage.[31]

[30]See B. J. Wakefield, ORGANOLITHIUM REAGENTS (1988), which is hereby incorporated by reference.
[31]See Callahan et al., "The Tertiary Butyl Group as a Blocking Agent for Hydroxyl, Sulfhydryl and Amido Functions in Peptide Synthesis," 85 J. AM. CHEM. SOC. 201 (1963); Nishimura et al., "New Method for Removing the S-p-Methoxybenzyl and S-t-Butyl Groups of Cysteine Residues with Mercuric Trifluoroacetate," 26 CHEM. PHARM. BULL. 1576 (1978); both of which are hereby incorporated by reference.

Scheme III shows the planned process to extend the molecular chains to at least 100 Å in length.

Several options are available for fabrication of sub-100 Å contact probe spacing. For monotype contacts, STM lithography, etching, or diamond-AFM tip[32] scribing of a ~50 Å gap in a metal wire 100–200 Å wide is possible. Sub-100 Å polytype metal contacts, for a selective attachment polarity (ie., Au and Pt) is possible by a combination of step-edge and angle evaporation techniques. Alternatively, chain extension of the conjugated oligomers, similar to the process outlined in Schemes I and II will be used to continue the chain length extensions. We use a combination of palladium and nickel-catalyzed cross-coupling reactions and palladium-copper-catalyzed Sonogashira couplings. These are the most advanced and highest yielding carbon-carbon couplings for the required synthesis.[33] The extension to 100 Å is achievable from the nano-fabrication standpoint, and is desirable for variable length connectivity considerations.

[32]This technique is preferably performed with modified instruments from Park Scientific Instruments.
[33]See Stille, "The Palladium-Catalyzed Cross-Coupling Reactions of Organotin Reagents with Organic Electrophiles", 25 ANGEW.CHEM.INT.ED.ENGL. 508 (1986); Stille, "Palladium Catalyzed Coupling of Organotim Reagents with Organic Electrophiles," 57 PURE & APPL.CHEM. 1771 (1985); Sonogashira et al., "A Convenient Synthesis of Acetylenes: Catalytic Substitutions of Acetylenic Hydrogen with Bromoalkenes, Iodoarenes, and Bromopyridines", 50 TETRAHEDRON LETT. 4467 (1975); Stephans et aL, "The Substitution of Aryl iodides with Cuprous Acetylides: A Synthesis of Tolanes and Heterocyclics," 28 J.ORG.CHEM. 3313 (1963); Suffert et al., "Towards Molecular Electronics: A New Family of Aromatic Polyimine Chelates Substituted with Alkyne Groups", 32 TETRAHEDRON LETT. 757 (1991); all of which are hereby incorporated by reference.

Modeling will speed identification of the candidate organics that are stable, solution synthetic, conjugatable with selective attachment ends and barriers, have acceptable conductivity and mechanical strength, and attach strongly to particular metal groups with good ohmic contact. These are not necessarily compatible or automatic requirements. It should be stressed that complex device structures cannot be realized with "Edisonian" approaches, and that interactive modeling is key to realizing the goals of this program. Crucial to the success of spontaneously assembled molecular circuits is a detailed understanding of the electronic and mechanical (thermoelastic) properties of the polymers and junctions used as the fundamental assembly blocks of the

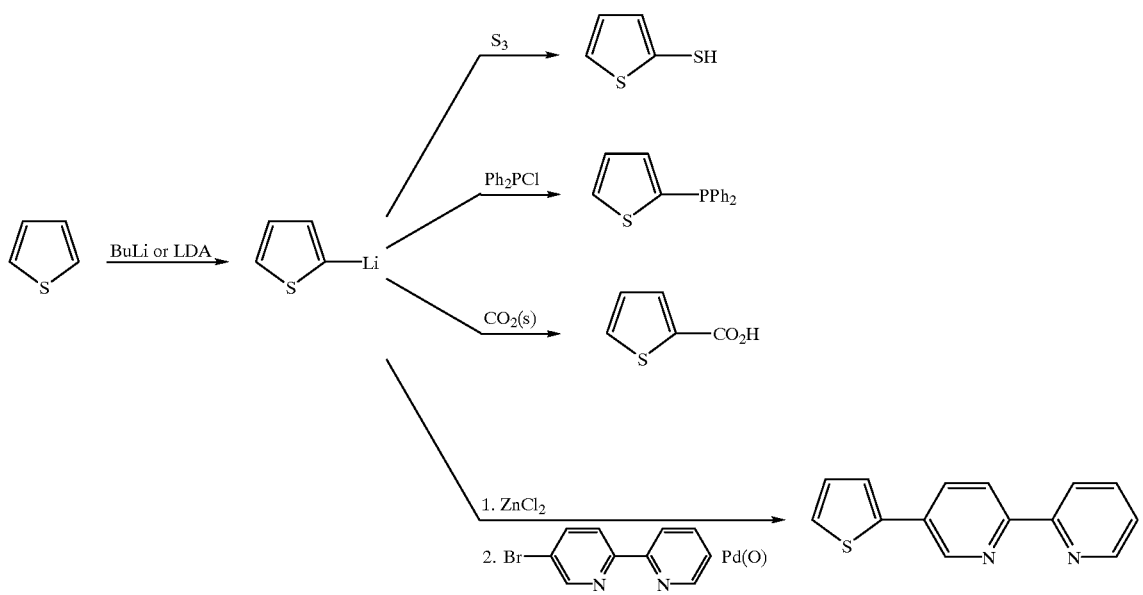

design. A modeling effort to attack this problem decomposes into two phases; 1) construction of molecular wires and gluing pads, and 2) design of active gain elements. Modeling tools for detailing the orbital structure responsible for delocalization include:

Hartree-Fock methods, which give the most accurate results, but are limited to approximately 70 atoms (on a Cray Y clais machine or a Connection Machine −2).

MNDO (modified neglect of differential overlap) techniques, which can easily deal with the wavefunctions or orbital structure of approximately 250 atoms on sophisticated scientific workstations.

Extended Hückel methods, which can calculate orbital structure of ten thousand atoms, but are sufficiently semi-empirical that they are considered unreliable for complex delocalization calculations.

The strategy will be to use MNDO methods to quickly identify candidates, cross-checking with detailed Hartree-Fock simulations to insure that the MNDO methods have given accurate results. The first objective is to find and analyze suitable conducting oligomers (monomers), examining delocalization as a function of unit size and the binding energy of these oligomers to each other. This will build a catalog of conductive chains which the experimentalists can interactively design with, and have appropriate conductivity and stability. The second objective is to examine the end group problem and the interaction of end groups with various metals, for selectivity and binding strength, satisfying conductivity and stability constraints (the functionalization of endgroups onto such short chains will alter the orbital behavior of the chain-endgroup complex, as well as when the endgroup is attached to the metal). An attractive flexibility of the fabrication approach is that the functionalized end group need not be restricted to just metal attachment. Attachment of selective molecules to various semiconductors (and oxides) has been demonstrated. For example, one could fabricate an alignment substrate that is the combination of heterostructures and metallic contacts (perhaps with appropriate vias in an overlayer) for very general structures. This capability, as well as the ability to deposit the selective attachment oligomers from solution, and possible CVD deposition of some critical steps (as in the to be described organic quantum dot work), gives the fabricator tremendous flexibility.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

Note that self-aligned deposition from solution of contacts from oligomer ends can be targeted to selectively to semiconductor contact areas, as well as to metal pads.

The conductive oligomers do not have to thiophene or thiophene derivatives. Alternative conductive oligomers can be used if they provide adequate conductivity and stability. In particular, it is contemplated that doncutive oligomers with a ladder structure may be advantageous for some applications.

Note that the conductive oligomers, and the charge-transfer structures, do not necessarily have to be organic compounds, although the vast experience base of organic chemistry simplifies the fabrication detailed above.

Note that the ultimate local environment of the conductive polymers does not strictly have to be dry, as in the presently preferred embodiment. Alternatively, the molecular electronic material can be allowed to reside in a solvent environment. This is preferably a nonpolar solvent, but could alternatively be aqueous or another polar solvent.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. A process for manufacturing integrated circuits, comprising the steps of:
   a.) providing a substrate;
   b.) forming a plurality of transistors on said substrate;
   c.) forming conductive interconnects on said substrate to interconnect said transistors in a predetermined electrical configuration;
   d.) forming, among said interconnects, pairs of conductive contact pads; and
   e.) through a process of self-aligned spontaneous assembly of chemically synthesized interconnects, forming polymeric conductors to electrically connect respective pairs of conductive pads.

2. The process of claim 1, wherein said pairs include a first metal and a second metal, and said polymeric conductors attach asymmetrically with a first terminus attached to said first metal and a second termninus attached to said second metal.

3. The process of claim 1, wherein said polymeric conductors each consist of an oligomer of a precisely predetermined number of units.

4. The process of claim 1, wherein said polymeric conductors each consist of an oligomer of a precisely predetermined number of units, and wherein a first step forms a first set of oligomers having a first predetermined length, and a second step forms a second set of oligomers having a second predetermined length.

* * * * *